(12) United States Patent
Okamoto et al.

(10) Patent No.: US 7,256,501 B2
(45) Date of Patent: Aug. 14, 2007

(54) SEMICONDUCTOR DEVICE AND MANUFACTURING METHOD OF THE SAME

(75) Inventors: Masahide Okamoto, Yokohama (JP); Osamu Ikeda, Yokohama (JP); Akira Muto, Haruna (JP); Yukihiro Satou, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 26 days.

(21) Appl. No.: 11/281,502

(22) Filed: Nov. 18, 2005

(65) Prior Publication Data
US 2006/0138532 A1    Jun. 29, 2006

(30) Foreign Application Priority Data
Dec. 24, 2004 (JP) .............................. 2004-372560

(51) Int. Cl.
*H01L 23/12* (2006.01)
*H01L 23/48* (2006.01)

(52) U.S. Cl. ............... 257/772; 257/678; 257/750; 257/762; 257/769; 257/770; 257/779; 257/E23.001

(58) Field of Classification Search ............ None
See application file for complete search history.

(56) References Cited

U.S. PATENT DOCUMENTS 4,984,051 A * 1/1991 Yoshida .................. 257/690
6,215,185 B1 * 4/2001 Kikuchi et al. ............ 257/747
7,193,319 B2 * 3/2007 Sasaki et al. .............. 257/724

FOREIGN PATENT DOCUMENTS

JP       2000-223634      8/2000

* cited by examiner

*Primary Examiner*—Jasmine Clark
(74) *Attorney, Agent, or Firm*—Antonelli, Terry, Stout & Kraus, LLP.

(57) ABSTRACT

In a semiconductor device having a package structure in which lead terminals connected to electrodes on both of the upper and lower surfaces of a semiconductor chip are exposed from both of the upper and lower surfaces and side surfaces of a sealing body formed of resin, electrodes of the semiconductor chip and the lead terminals are connected by Pb-free connection parts each having a configuration of connection layer/stress buffer layer/connection layer. In each connection part, the connection layer is formed of an intermetallic compound layer having a melting point of 260° C. or higher or Pb-free solder having a melting point of 260° C. or higher, and the stress buffer layer is formed of a metal layer having a melting point of 260° C. or higher and having a function to buffer the thermal stress.

13 Claims, 11 Drawing Sheets

SEMICONDUCTOR DEVICE AND MANUFACTURING METHOD OF THE SAME

CROSS-REFERENCE TO RELATED APPLICATION

The present application claims priority from Japanese Patent Application No. JP 2004-372560 filed on Dec. 24, 2004, the content of which is hereby incorporated by reference into this application.

TECHNICAL FIELD OF THE INVENTION

The present invention relates to a semiconductor device and manufacturing technology thereof. More particularly, it relates to packaging technology of a semiconductor device.

BACKGROUND OF THE INVENTION

As a high-power semiconductor device, for example, a semiconductor device in which a semiconductor chip which forms a power supply transistor such as a power MOSFET (Metal Oxide Semiconductor Field-Effect-Transistor), an IGBT (Insulated Gate Bipolar Transistor), or a bipolar power transistor is incorporated in a sealing body is known.

A power MOSFET device has a structure in which a power MOSFET chip is incorporated in a sealing body. As a power MOSFET device, a structure in which a metal member serving as a drain terminal is exposed on the bottom surface of a sealing body made of insulating resin, and a source lead terminal and a gate lead terminal are disposed on one side of the sealing body is known. In the structure, the source lead terminal and the gate lead terminal are bent at a part, and the part is exposed on the upper surface of the sealing body. The source lead terminal and the gate lead terminal extending in the sealing body are respectively electrically connected to a source electrode and a gate electrode on the upper surface of a semiconductor chip which is fixed on the metal member. These lead terminals are bonded onto the source electrode and the gate electrode by ultrasonic compression bonding via gold (Au) bumps uniformly disposed by a ball bonding method using bonding wires (hereinafter, simply referred to as wires). More specifically, after distal ends of the wires are connected onto the source electrode and the gate electrode by a thermocompression bonding method, the wires are pulled to be ruptured so that stud-type bump electrodes are formed, and the bump electrodes are connected to the lead terminals by the ultrasonic method. For example, this is disclosed in Japanese Patent Application Laid-Open Publication No. 2000-223634 (Patent Document 1). Other methods for connecting electrodes of a semiconductor chip with lead terminals include a method in which the electrodes of the semiconductor chip are electrically connected to the lead terminals by solder. In this method, since metal compounds are formed in the boundary surfaces between the electrodes and the solder and the connection property is degraded, in order to prevent generation of the metal compounds, an under barrier metal layer (Under Bump Metal: UBM layer) formed by sequentially stacking layers of, for example, titanium (Ti) and nickel (Ni) in this order from below is provided on the electrodes. However, the manufacturing cost of the semiconductor device increases since the UBM layer is formed by a process such as sputtering.

SUMMARY OF THE INVENTION

However, the inventors of the present invention have found that the semiconductor device having the above-described package configuration has the following problems.

That is, in the method in which electrodes of a semiconductor chip and lead terminals are connected by ultrasonic via gold bumps, since the bump electrodes and the lead terminals are ultrasonically vibrated in a heated state so as to achieve intermetallic connection, the semiconductor chip is strongly pressed against the lead terminals. Meanwhile, the bump electrodes formed on the electrodes of the semiconductor chip have high strength since they are formed of wires. Therefore, large force is applied to the semiconductor chip at the time of the ultrasonic connection. As a result, sometimes the semiconductor chip breaks or cracks are generated in the semiconductor chip which is formed of fragile semiconductor, thereby breaking the MOSFET.

Moreover, although gold bump connection is a Pb-free connection, there is a problem that the manufacturing cost is largely increased since expensive gold (Au) is used.

Moreover, since the amount of current to be used in a power transistor is large, a package structure excellent in heat dissipation ability for dissipating the heat generated from a semiconductor chip to the outside is desired. In addition, also for power transistors, a low-cost highly-reliable package structure is desired. In order to produce such a highly reliable package structure at low cost, resin sealing of a semiconductor chip is effective. In this case, however, since the resin has low heat conductivity, the heat dissipation ability is lowered. Therefore, in a package in which a semiconductor chip having a power transistor is sealed with resin, as disclosed in above-mentioned Patent Document 1, it is effective to use a heat dissipation structure which dissipates heat from both upper and lower surfaces, in which part of lead terminals connected to electrodes on the principal surface of a semiconductor chip is exposed on the upper surface of the resin case, while die terminals connected to electrodes on the rear surface of the semiconductor chip, which is on the side opposite to the principal surface, are exposed on the lower surface of the resin case, which is on the side opposite to the upper surface. However, since the heat dissipation structure which dissipates heat from both upper and lower surfaces disclosed in the above-mentioned Patent Document 1 has a structure in which die terminals are not exposed from the side surfaces of the resin case, it has the problems that formation of solder fillets which are necessary for improving the reliability of solder connection in the soldering at the mounting is difficult, and checking the soldering quality by visual inspection is also difficult.

In addition, in the configuration of above-mentioned Patent Document 1, the lead terminals do not have the part that is positioned in the resin case, and the entire upper surfaces of the lead terminals are exposed from the resin case. Therefore, the lead terminals easily fall off the resin case, which is a factor causing deterioration of the reliability.

An object of the present invention is to provide the technologies capable of suppressing or preventing the breakage of a semiconductor chip.

Another object of the present invention is to provide technologies capable of connecting the electrodes of a semiconductor chip to lead terminals by Pb-free solder without causing increase of cost.

Another object of the present invention is to provide technologies capable of checking the soldering quality at the mounting of a semiconductor device by visual inspection.

Another object of the present invention is to provide technologies capable of improving the heat dissipation ability and reliability of a semiconductor device.

The above and other objects and novel characteristics of the present invention will be apparent from the description of this specification and the accompanying drawings.

The typical ones of the inventions disclosed in this application will be briefly described as follows.

The present invention provides a semiconductor device which comprises:

a semiconductor chip having first and second principal surfaces which are positioned on opposite sides, a first electrode formed on the first principal surface, and second and third electrodes formed on the second principal surface;

a resin sealing body which seals the semiconductor chip and has first and second principal surfaces positioned on opposite sides, in which the first principal surface of the resin sealing body is positioned on the first principal surface side of the semiconductor chip and the second principal surface of the resin sealing body is positioned on the second principal surface side of the semiconductor chip;

a first conductive member having one end, which is positioned on the first electrode of the semiconductor chip and connected to the first electrode of the semiconductor chip via first connection means, and the other end on the opposite side of the one end, which is positioned on the second principal surface side of the resin sealing body in comparison with the one end and exposed from the resin sealing body;

a second conductive member connected to the second electrode of the semiconductor chip via second connection means; and a third conductive member connected to the third electrode of the semiconductor chip via third connection means, wherein the one end of the first conductive member is exposed from the first principal surface of the resin sealing body, the second and third conductive members are exposed from the second principal surface and side surfaces of the resin sealing body, and each of the first, second, and third connection means includes: a stress buffer layer having a function to buffer thermal stress generated by a difference in thermal expansion coefficients between the first, second, and third conductive members and the semiconductor chip; a first connection layer formed on the semiconductor chip side of the stress buffer layer and having a function to connect the stress buffer layer to the first, second, and third electrodes of the semiconductor chip; and a second connection layer formed on the first, second, and third conductive member side of the stress buffer layer and having a function to connect the stress buffer layer to the first, second, and third conductive members.

The present invention provides a semiconductor device which comprises:

a semiconductor chip having first and second principal surfaces which are positioned on opposite sides, a first electrode formed on the first principal surface, and second and third electrodes formed on the second principal surface;

a resin sealing body which seals the semiconductor chip and has first and second principal surfaces positioned on opposite sides, in which the first principal surface of the resin sealing body is positioned on the first principal surface side of the semiconductor chip and the second principal surface of the resin sealing body is positioned on the second principal surface side of the semiconductor chip;

a first conductive member having a first portion positioned on the first electrode of the semiconductor chip, connected to the first electrode of the semiconductor chip via first connection means, and exposed from the first principal surface of the resin sealing body, a second portion integrally formed with the first portion and positioned in the resin sealing body, and a third portion integrally formed with the second portion and exposed from the second principal surface of the resin sealing body;

a second conductive member connected to the second electrode of the semiconductor chip via second connection means and having a part exposed from the second principal surface of the resin sealing body; and a third conductive member connected to the third electrode of the semiconductor chip via third connection means and having a part exposed from the second principal surface of the resin sealing body, wherein each of the first, second, and third connection means includes: a stress buffer layer having a function to buffer thermal stress generated by a difference in thermal expansion coefficients between the first, second, and third conductive members and the semiconductor chip; a first connection layer formed on the semiconductor chip side of the stress buffer layer and having a function to connect the stress buffer layer to the first, second, and third electrodes of the semiconductor chip; and a second connection layer formed on the first, second, and third conductive member side of the stress buffer layer and having a function to connect the stress buffer layer to the first, second, and third conductive members.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, components having the same function are denoted by the same reference symbols throughout the drawings for describing the embodiment, and the repetitive description thereof will be omitted. Hereinafter, embodiments of the present invention will be described in detail with reference to the accompanying drawings.

First Embodiment

Figure 1:
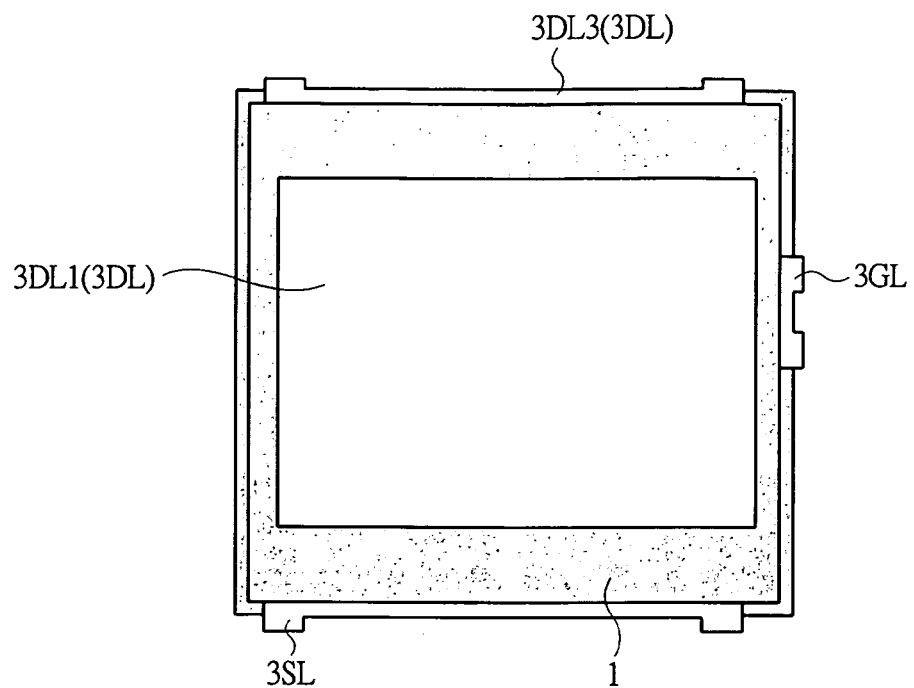
FIG. 1 is a plan view of an upper surface of a sealing body of a semiconductor device of an embodiment of the present invention.
Figure 2:
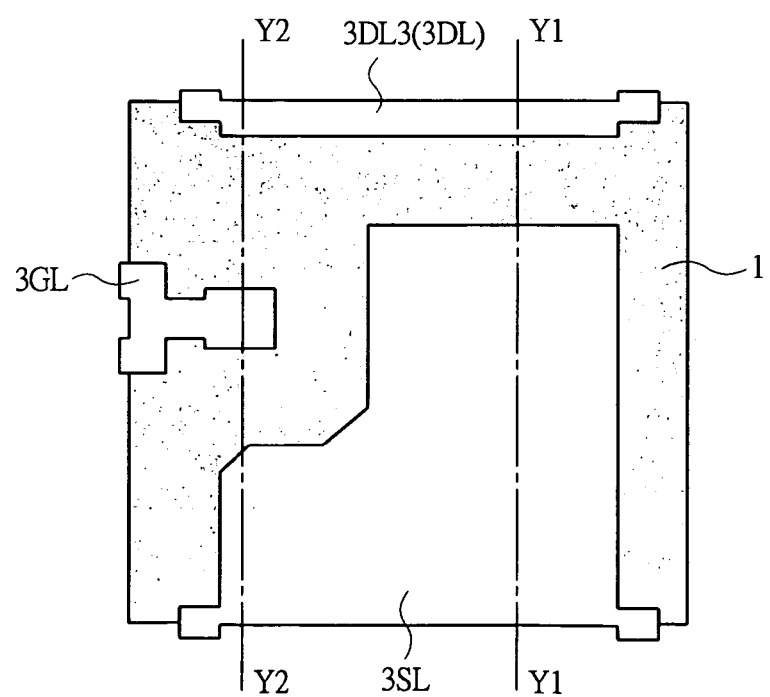
FIG. 2 is a plan view of a lower surface of the sealing body of the semiconductor device of FIG. 1.
Figure 3:
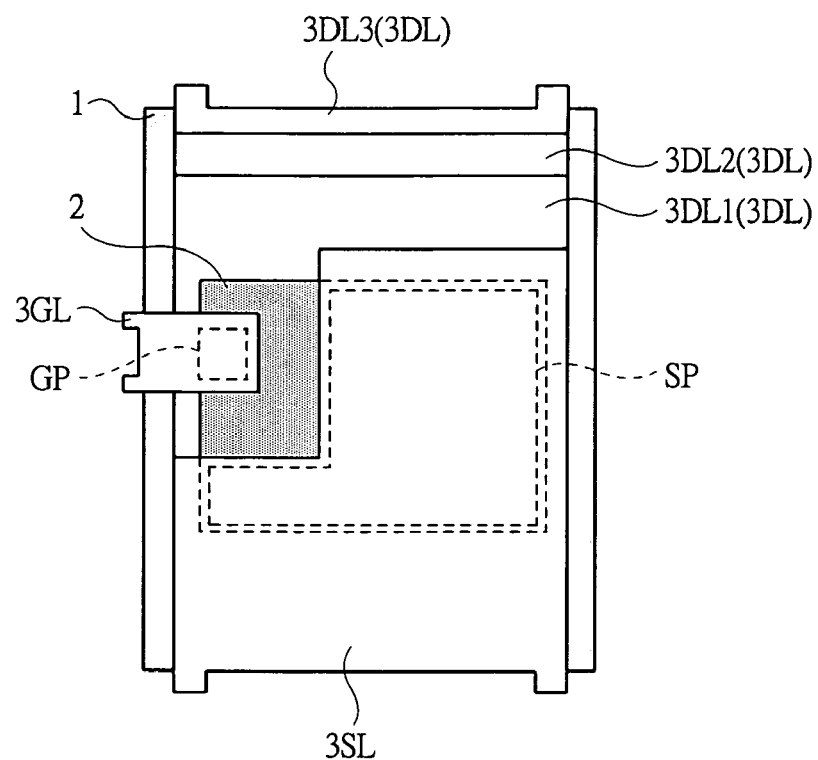
FIG. 3 is a plan view showing the inner structure of the sealing body of the semiconductor device viewed from the lower surface side.
Figure 4:
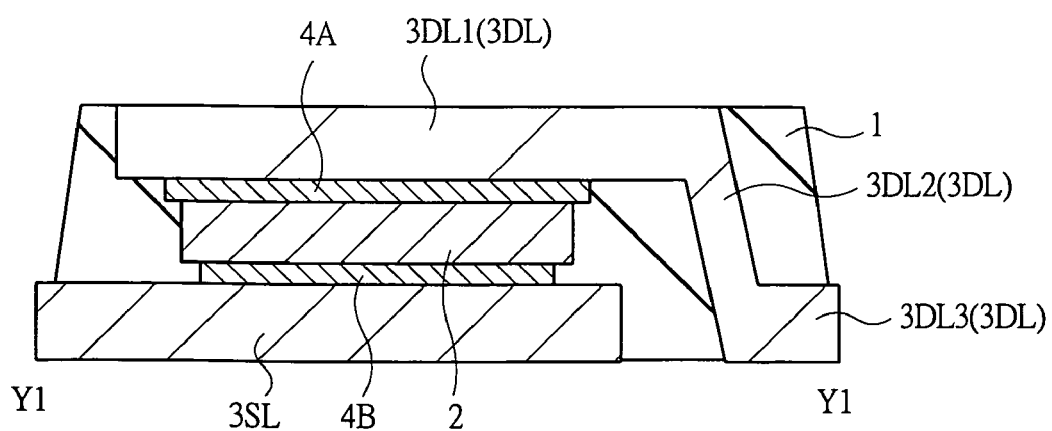
FIG. 4 is a cross-sectional view taken along the line Y1-Y1 of FIG. 2.
Figure 5:
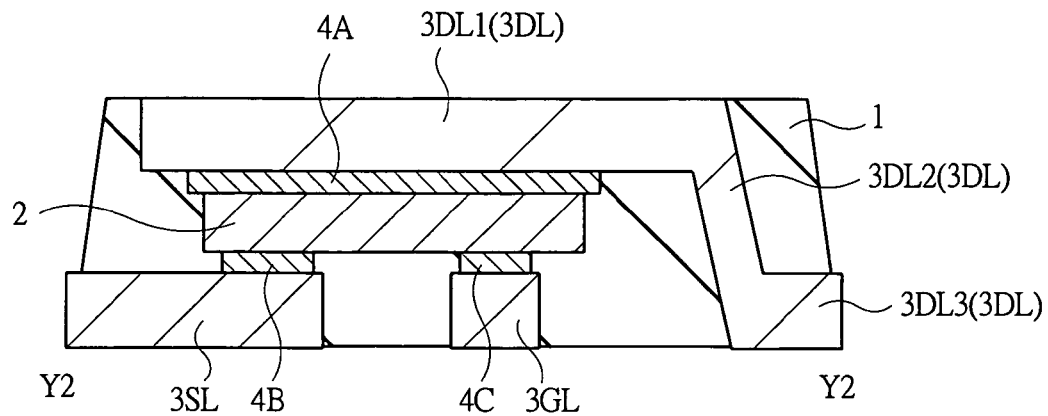
FIG. 5 is a cross-sectional view taken along the line Y2-Y2 of FIG. 2.
Figure 6:
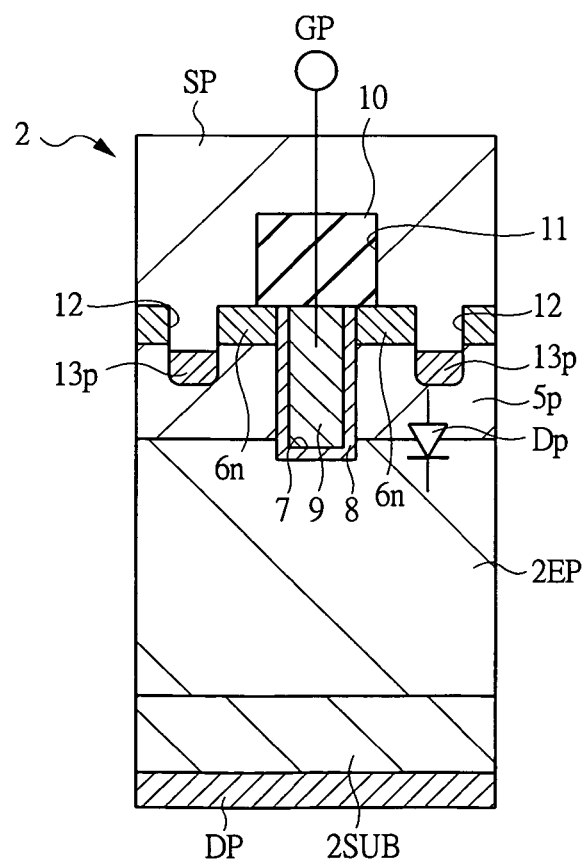
FIG. 6 is a cross-sectional view of an example of a transistor cell formed in a semiconductor chip which is in the sealing body of FIG. 1.
Figure 7:
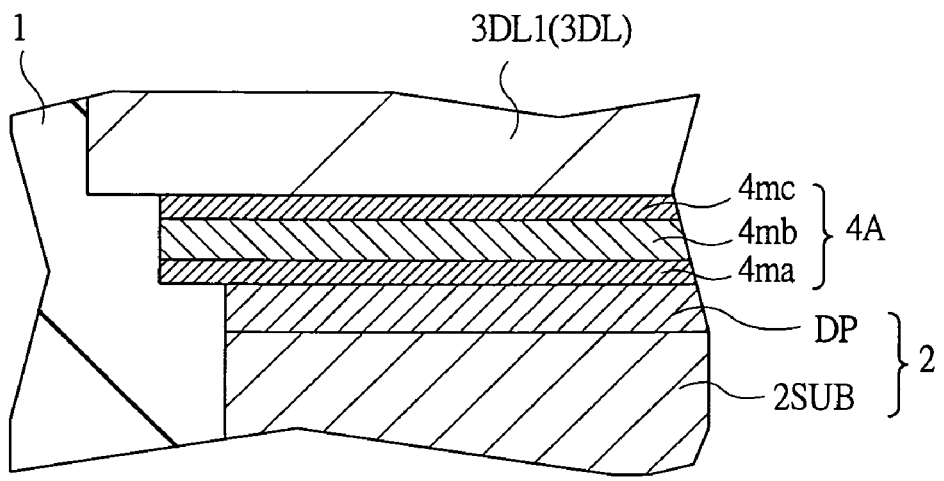
FIG. 7 is an enlarged cross-sectional view of a connection part which connects a drain lead terminal to a drain pad of a semiconductor chip in the semiconductor device of FIG. 1.
Figure 8:
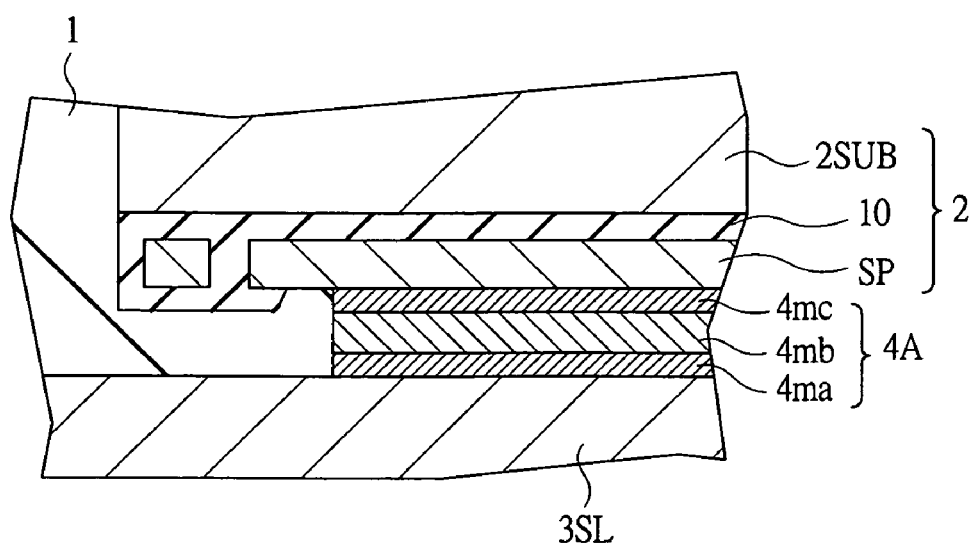
FIG. 8 is an enlarged cross-sectional view of a connection part which connects a source lead terminal to a source pad of the semiconductor chip in the semiconductor device of FIG. 1.
Figure 9:
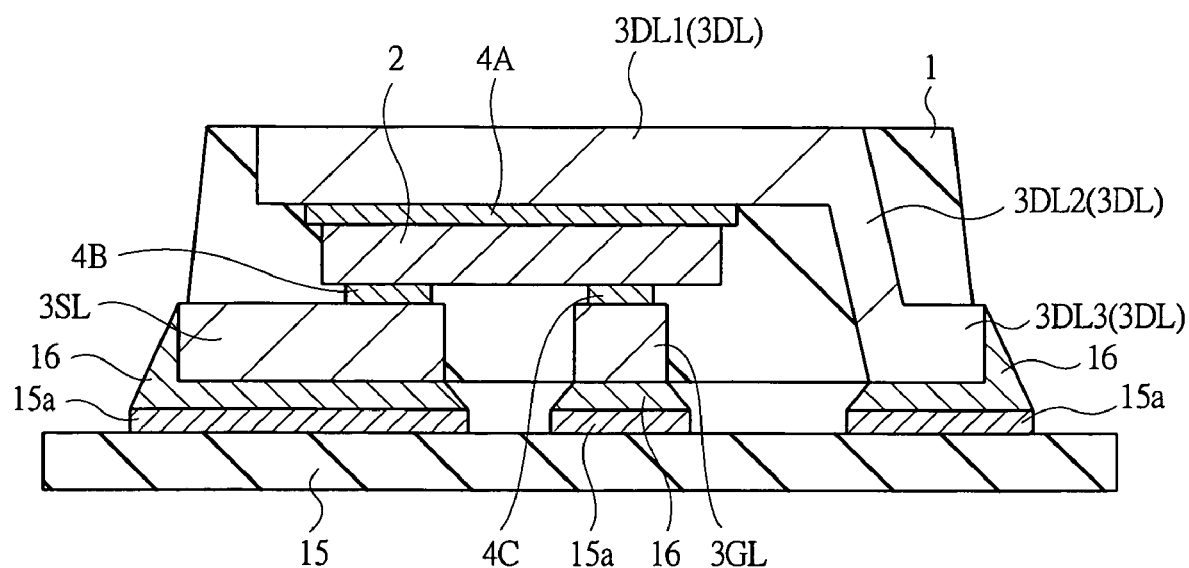
FIG. 9 is a cross-sectional view of the mounted semiconductor device.

FIG. 1 is a plan view of an upper surface (first principal surface) of a sealing body 1 of a power transistor (semiconductor device) according to a first embodiment; FIG. 2 is a plan view of a lower surface (second principal surface, mounting surface) of the sealing body 1 of the power transistor of FIG. 1; FIG. 3 is a plan view showing the inner structure of the sealing body 1 of the power transistor of FIG. 1 and FIG. 2 viewed from the lower surface side; FIG. 4 is a cross-sectional view taken along the line Y1-Y1 of FIG. 2; FIG. 5 is a cross-sectional view taken along the line Y2-Y2 of FIG. 2; FIG. 6 is a cross-sectional view of an example of a transistor cell formed in a semiconductor chip 2 in the sealing body 1 of FIG. 1, etc.; FIG. 7 is an enlarged cross-sectional view of a connection part (first connection means) 4A which connects a drain lead terminal (first conductive member, external terminal) 3DL to a drain pad (first electrode) DP of the semiconductor chip 2 in the power transistor of FIG. 1, etc.; FIG. 8 is an enlarged cross-sectional view of a connection part (second connection means) 4B which connects a source lead terminal (second conductive member, external terminal) 3SL to a source pad (second electrode) SP of the semiconductor chip 2 in the power transistor of FIG. 1, etc.; and FIG. 9 is a cross-sectional view of a mounted power transistor.

The power transistor of the first embodiment is composed of the sealing body 1, the semiconductor chip 2, and the lead terminals 3DL, 3SL, and 3GL.

In order to reduce stress and the like, the sealing body 1 which forms the external appearance of the power transistor is formed of, for example, epoxy-based thermosetting resin to which a phenolic curing agent, silicone rubber, filler, etc. are added, and it has the principal surface (first principal surface, upper surface) and the rear surface (second principal surface, lower surface, mounting surface) which are positioned on the sides opposite to each other in the width direction thereof. The planar shape of the principal surface and the rear surface of the sealing body 1 is, for example, a rectangle. A transfer molding method which is suitable for mass production is employed as a method for forming the sealing body 1. The transfer molding method is a method in which forming dies (molding dies) having a pot, runners, resin injection gates, cavities, etc. are used, and the thermosetting resin is injected from the pot to the interior of the cavities through the runners and the resin injection gates, thereby forming resin sealing bodies.

The above-mentioned semiconductor chip 2 is sealed in the sealing body 1. When the semiconductor chip 2 is sealed with the sealing body 1 in this manner, the reliability of the power transistor is improved in comparison with the structure in which the semiconductor chip 2 is not sealed with resin. The semiconductor chip 2 has a principal surface (second principal surface) and a rear surface (first principal surface) which are positioned on the sides opposite to each other in the thickness direction. The planar shape of the principal surface and the rear surface of the semiconductor chip 2 is, for example, a rectangle, and the planar dimensions thereof are, for example, about 3.9 mm in length and about 2.8 mm in width.

The principal surface (second principal surface) of the semiconductor chip 2 is positioned on the rear surface (second principal surface, lower surface) side of the sealing body 1, and the rear surface (first principal surface) of the semiconductor chip 2 is positioned on the principal surface (first principal surface, upper surface) side of the sealing body 1. A source pad (second electrode) SP and a gate pad (third electrode) GP are formed on the principal surface of the semiconductor chip 2. The gate pad GP is a quadrangular region in the plane with an area smaller than that of the source pad SP. Also, the source pad SP is a large rectangular (may be quadrangular) region and may have the structure in which the region having no pad is covered with an insulating layer. A drain pad (first electrode, rear surface electrode) DP is formed on the rear surface of the semiconductor chip 2.

The semiconductor chip 2 is mainly composed of a semiconductor substrate 2SUB made of, for example, single crystal silicon (Si). On the principal surface of the semiconductor substrate 2SUB, for example, a vertical power MISFET (Metal Insulator Semiconductor Field Effect Transistor) is formed as a transistor device. The vertical power MISFET has a configuration in which a plurality of fine transistor cells are connected in parallel in order to obtain large power. A cross-sectional view of an example of the transistor cell is shown in FIG. 6. Herein, the transistor cell of an n channel type vertical power MISFET is shown as an example.

The semiconductor substrate 2SUB constituting the semiconductor chip 2 is made of, for example, n$^+$ type single crystal silicon, and an epitaxial layer 2EP made of n$^-$ type single crystal silicon is formed thereon. The plurality of transistor cells of the power MISFETs are formed in the active region which is surrounded by a field insulating film of the principal surface of the epitaxial layer 2EP and p wells in the layer below it.

Each transistor cell is, for example, an n channel type vertical power MISFET Q1 having a trench gate structure. With this trench gate structure, the transistor cells can be miniaturized and integrated in a high density. The transistor cell has the semiconductor substrate 2SUB and the epitaxial layer 2EP having a function as a drain region, a p type semiconductor region 5$p$ having a function as a channel forming region, an n$^+$ type semiconductor region 6$n$ having a function as a source region, a trench 7 formed in the thickness direction of the epitaxial layer 2EP, a gate insulating film 8 formed on the bottom surface and the side surface of the trench 7, and a gate electrode 9 embedded in the trench 7 via the gate insulating film 8.

The above-mentioned gate pad GP is electrically connected to the gate electrode 9 in the trench 7 through gate wiring of the principal surface of the semiconductor chip 2. The gate electrode 9 and the gate wiring are made of, for example, low resistance polycrystalline silicon. The depth of the trench 7 is set such that it penetrates through the p type semiconductor region 5$p$. The gate insulating film 8 is made of, for example, silicon oxide (SiO$_2$). The above-mentioned source pad SP is made of, for example, aluminum (Al) or an aluminum alloy, and electrically connected to the n$^+$ type source semiconductor region 6$n$ through a contact hole 11 formed in an insulating layer 10. Furthermore, the source pad SP is electrically connected to a p$^+$ type semiconductor region 13$p$ through a trench 12 formed in the epitaxial layer 2EP, and further electrically connected to the p type semiconductor region 5$p$ for forming a channel through the region 13$p$. The insulating layer 10 is made of, for example, silicon oxide (SiO$_2$) and also has a function to insulate the source pad SP and the gate electrode 9. The above-mentioned drain pad DP is formed by sequentially stacking layers of, for example, titanium (Ti), nickel (Ni), and gold (Au) on the rear surface of the semiconductor substrate 2SUB.

The channel of such power MISFET Q1 is formed in the p type semiconductor region 5$p$ to which the side surface of the gate electrode 9 of each transistor cell is opposed via the gate insulating film 8 and between the drain epitaxial layer 2EP and the n$^+$ type source semiconductor region 6$n$ so as to extend along the side surface of the gate electrode 9 (i.e., the side surface of the trench 7) in the thickness direction of the semiconductor substrate 2SUB (direction intersecting with the principal surface and the rear surface of the semiconductor substrate 2SUB). Note that the reference symbol "Dp" denotes an internal diode (parasitic diode).

The drain pad (rear surface electrode) DP of the rear surface (first principal surface) of the semiconductor chip 2 is bonded and electrically connected to the drain lead terminal 3DL via the connection part (first connection means) 4A.

The lead terminal 3DL is a lead terminal which is for the drain of the power transistor. The lead terminal 3DL is composed of, for example, a copper alloy plate having high thermal conductivity and electric conductivity, and the thickness thereof is, for example, about 0.2 mm. The lead terminal 3DL is formed by bending and has the structure including a first portion (die pad) 3DL1, a second portion (inner lead) 3DL2, and a third portion (outer lead) 3DL3. The distance between the highest surface (the upper surface of the first portion 3DL1) and the lowest surface (the lower surface of the third portion 3DL3) of the lead terminal 3DL is, for example, about 0.6 mm, and this distance, i.e., the height corresponds to the thickness of the sealing body 1.

A part of the first portion 3DL1 of the lead terminal 3DL1 is positioned on the drain pad DP of the semiconductor chip 2, and the other part intersects with one side of the semiconductor chip 2 and extends to a position outside the side. The drain pad DP is bonded to the semiconductor chip 2 mounting surface of the rear surface of the first portion 3DL1 via the connection part 4A. On the other hand, the upper surface of the first portion 3DL is exposed from the upper surface (first principal surface) of the sealing body 1. Therefore, the heat generated by the operation of the semiconductor chip 2 can be well dissipated to the outside through the first portion 3DL1 of the lead terminal 3DL.

The second portion 3DL2 of the lead terminal 3DL is integrally formed with the first portion 3DL1, and is bent toward the rear surface (second principal surface) side of the sealing body 1 from the above-described other part of the first portion 3DL1. The second portion 3DL2 has a function as an offset part for separating the first portion 3DL1 from the third portion 3DL3 in the thickness direction of the sealing body 1. The second portion 3DL2 is positioned in the sealing body 1. Therefore, even though the first portion 3DL1 of the lead terminal 3DL is exposed from the upper surface (first principal surface) of the sealing body 1 in order to improve the heat dissipation ability, failure in which the lead terminal 3DL falls off the sealing body 1 can be suppressed or prevented. Consequently, the reliability of the power transistor can be improved.

As shown in FIG. 7, the third portion 3DL3 of the lead terminal 3DL is integrally formed with the second portion 3DL2 and extends from the second portion 3DL2 in the same direction as the extending direction of the abovementioned other part of the first portion 3DL1 (direction away from the semiconductor chip 2). Also it is positioned on the rear surface (second principal surface) side of the sealing body 1 and is exposed from the rear surface of the sealing body 1 and a first side surface of the sealing body 1. More specifically, one end of the lead terminal 3DL is positioned on the drain pad DP of the semiconductor chip 2, connected to the drain pad DP via the connection part, and exposed from the principal surface of the sealing body 1, while the other end which is opposite to the one end is positioned on the rear surface (second principal surface) side of the sealing body 1 and exposed from the rear surface and the first side surface of the sealing body 1.

The connection part 4A connecting the lead terminal 3DL and the drain pad DP has three-layer stacked structure of a connection layer (first connection layer) 4ma, a stress buffer layer 4mb, and a connection layer (second connection layer) 4mc.

The connection layer 4ma of the connection part 4A has a function to well bond the drain pad DP of the rear surface of the semiconductor chip 2 with the stress buffer layer 4mb of the connection part 4A, and is well bonded and electrically connected to the drain pad DP. Also, the connection layer 4mc of the connection part 4A has a function to well bond the lead terminal 3DL with the stress buffer layer 4mb of the connection part 4A, and is well bonded and electrically connected to the lead terminal 3DL. These connection layers 4ma and 4mc are composed of metal layers or metal compound layers having a melting point higher than the melting point of later-described adhesive used to connect the lead terminals 3DL, 3SL, and 3GL to electrodes of a printed circuit board when the sealing body 1 is to be mounted on the printed circuit board. Otherwise, the connection layers 4ma and 4mc will also melt when the sealing body 1 is to be mounted on the printed circuit board. However, the melting point of the connection layers 4ma and 4mc is, for example, 260° C. or higher under existing conditions when the temperature of the power transistor in operation and temperatures of environment-temperature cycling tests, etc. are taken into consideration.

The connection layers 4ma and 4mc are composed of compound layers which are formed by the reaction at the time of connection between, for example, at least one high melting point metal among Cu (copper), Ag (silver), Ni (nickel), and Au (gold) and one of Sn—Ag (tin-silver)-based, Sn—Cu (tin-copper)-based, Sn—Ag—Cu (tin-silver-copper)-based, Sn—Zn (tin-zinc)-based, Sn—Zn—Bi (tin-zinc-bismuth)-based, Sn—In (tin-indium)-based, In—Ag (indium-silver)-based, In—Cu (indium-copper)-based, Bi—Sn (bismuth-tin)-based, and Bi—In (bismuth-indium)-based reactive Pb-free solders. The Sn—Ag-based solder can be exemplified by an Sn-3.5Ag solder (melting point: 221° C.). The Sn—Ag—Cu-based solder can be exemplified by an Sn-3Ag-0.5Cu solder. Also, the Sn—Zn-based solder can be exemplified by an Sn-9Zn-based solder (melting point: 198.5° C.). Also, the Sn—In-based solder can be exemplified by 48Sn—In and Sn-51In solders (melting point: 120° C.). The thickness of the connection layers 4ma and 4mc is, for example, about 10 μm.

As the Pb-free solder of the connection layers 4ma and 4mc, the solder made of a plurality of metals has better wettability than that made of a single metal. However, in terms of the formation method, the solders made of two metals (for example, Sn—Ag-based, Sn—Cu-based, Sn—Zn-based, In—Ag-based, In—Cu-based, Bi—Sn-based, and Bi—In-based solders) can be readily formed in comparison with the solders made of three or more metals (for example, Sn—Ag—Cu-based and Sn—Zn—Bi-based solders) since the composition is readily controllable. Also, when a material containing Sn is used as the Pb-free solder, since the reaction speed of Cu or Ag with Sn is higher in comparison with that of Au (furthermore, the reaction speed of Ag with Sn is higher than that of Cu), the residual stress can be reduced more when Cu or Ag is used as the high melting point metal.

The stress buffer layer 4mb is composed of a metal layer having a melting point higher than the melting point of the later-described adhesive which connects the lead terminals 3DL, 3SL, and 3GL to the electrodes of a printed circuit board when the sealing body 1 is to be mounted on the printed circuit board. This is for the same reason as the connection layers 4ma and 4mc. Also in the case of the stress buffer layer 4mb, the melting point thereof is, for example, 260° C. or higher under existing conditions when the temperature of the power transistor in operation, the environmental test (reflow test (for example, about 260° C., 10 sec., 3 times), and the temperature cycling test (for example, −55° C. (30 min.)/150° C. (30 min.), 1,000 cycles) are taken into consideration.

Moreover, the stress buffer layer 4mb is composed of a metal layer having a thermal expansion coefficient which is between the thermal expansion coefficient of silicon forming the semiconductor substrate 2SUB (for example, about 3 ppm/° C.) and the thermal expansion coefficient of copper forming the lead terminal 3DL (for example, about 17 ppm/° C.). Since the difference in the thermal expansion coefficient between the lead terminal (copper) and the semiconductor chip (silicon) is large, sometimes cracks are formed in the semiconductor chip because the semiconductor chip cannot expand or contract equivalently with the expansion or contraction of the lead terminal having a large expansion coefficient. Therefore, in the first embodiment, since the thermal stress which is generated due to the difference in the thermal expansion coefficient between the semiconductor chip 2 and the lead terminal 3DL can be reduced by providing such stress buffer layer 4mb, the problem that cracks are formed in the semiconductor chip 2 due to the thermal stress and the problem that breakage occurs in the connection part 4A can be suppressed or prevented.

The material of such stress buffer layer 4mb is made of, for example, any one of Cu/invar alloy (Fe-36Ni)/Cu (CIC, thermal expansion coefficient is, for example, about 10 ppm/° C.), Cu/Cu20 composite material, a Cu—Mo (copper-molybdenum) alloy, Ti (titanium), Mo (molybdenum), and W (tungsten). The thickness of the stress buffer layer 4mb is thicker than that of the connection layers 4ma and 4mc, and is about 100 μm.

As described above, according to the first embodiment, the connection part 4A is formed to have a layer-stacked structure of the connection layer 4ma, the stress buffer layer 4mb, and the connection layer 4mc. As a result, the cost can be reduced compared in comparison with the case where the connection part 4A is made of Au only. Particularly, when Cu or Ag is used as the high melting point metal of the connection layers 4ma and 4mc, the cost can be further reduced in comparison with the case where Au is used as the high melting point metal.

Also, even when the connection layers 4ma and 4mc of the connection part 4A are a compound having hard and fragile properties, by providing the stress buffer layer 4mb between the connection layers 4ma and 4mc, the thermal stress which is generated due to the difference in the thermal expansion coefficient between the semiconductor chip 2 and the lead terminal 3DL can be buffered by the stress buffer layer 4mb. Therefore, the problem that cracks are formed in the semiconductor chip 2 due to the thermal stress and the problem that breakage occurs in the connection part 4A can be suppressed or prevented.

The above-described lead terminal 3SL is a lead terminal for the source of the power transistor. Also, the lead terminal (third conductive member, external terminal) 3GL is a lead terminal for the gate of the power transistor. These lead terminals 3SL and 3GL are composed of, for example, copper alloy plates having high thermal conductivity and electrical conductivity, and the thickness thereof is, for example, about 0.2 mm. The lead terminals 3SL and 3GL are flat, and are exposed from the rear surface (second principal surface) of the sealing body 1 and the side surfaces thereof other than the first side surface from which the third portion 3DL3 of the lead terminal 3DL is exposed. Among these, the lead terminal 3SL is exposed from the second side surface which is opposed to the first side surface from which the third portion 3DL3 of the lead terminal 3DL is exposed, and the lead terminal 3GL is exposed from the third side surface which is intersecting with the first and second side surfaces. More specifically, the lead terminals 3DL, 3SL, and 3GL are exposed from the respectively different side surfaces of the sealing body 1.

In this manner, the power transistor of the first embodiment has a heat dissipation structure which dissipates heat from both upper and lower surfaces in which, as described above, the first portion 3DL1 of the lead terminal 3DL is exposed from the principal surface (first principal surface) of the sealing body 1 and the lead terminals 3SL and 3GL are exposed from the rear surface (second principal surface) of the sealing body 1. Consequently, the heat generated in operation of the semiconductor chip 2 can be efficiently dissipated to the outside from the first portion 3DL1 of the lead terminal 3DL having a large area on the upper surface of the sealing body 1 and also can be efficiently dissipated to the outside from the lead terminal 3SL having a large area on the rear surface of the sealing body 1. Therefore, the heat dissipation ability of the power transistor can be improved.

The lead terminal 3SL is bonded and electrically connected to the source pad SP of the principal surface (second principal surface) of the semiconductor chip 2 via the connection part 4B. Also, the lead terminal 3GL is bonded and electrically connected to the gate pad GP of the principal surface of the semiconductor chip 2 via a connection part (third connection means) 4C. The rear surface exposed area and the connection area with the source pad SP of the lead terminal 3SL is larger than the rear surface exposed area and the connection area with the gate pad GP of the lead terminal 3GL.

In this manner, in the configuration of the power transistor of the first embodiment, the lead terminals 3DL, 3SL, and 3GL are connected to the drain pad DP, the source pad SP, and the gate pad GP. Therefore, the conduction paths between the lead terminals 3DL, 3SL, and 3GL and the respective drain pad DP, source pad SP, and gate pad GP can be shortened in comparison with a structure in which the drain pad DP, the source pad SP and the gate pad GP of the semiconductor chip 2 are electrically connected to the respective lead terminals by bonding wires. Thus, the on-resistance of the power transistor can be reduced. In addition, the inductance components which are parasitic in the conduction paths between the lead terminals 3DL, 3SL, and 3GL and the respective drain pad DP, source pad SP, and gate pad GP can be also reduced. Furthermore, since wire loops can be eliminated, the resin thickness of the sealing body 1 on the principal surface (second principal surface) of the semiconductor chip 2 can be reduced. Thus, the thickness of the power transistor can be reduced.

As shown in FIG. 8, Similar to the connection layers 4A, the connection part 4B which connects the lead terminal 3SL and the source pad SP has a three-layer stacked structure of a connection layer (first connection layer) 4ma, a stress buffer layer 4mb, and a connection layer (second connection layer) 4mc. Note that illustration and description of the configuration of the connection part 4C which connects the lead terminal 3GL and the gate pad GP will be omitted since it is the same as that of the connection part 4B.

In this case, the connection layer 4ma of the connection part 4B has a function to well bond the lead terminal 3SL with the stress buffer layer 4mb of the connection part 4B, and is well bonded and electrically connected to the lead terminal 3SL. Also, the connection layer 4mc of the connection part 4B has a function to well bond the source pad SP of the semiconductor chip 2 with the stress buffer layer 4mb of the connection part 4B, and is well bonded and electrically connected to the source pad SP. Similarly, the connection layer 4ma of the connection part 4C has a function to well bond the lead terminal 3GL with the stress buffer layer 4mb of the connection part 4C, and is well bonded and electrically connected to the lead terminal 3GL. Also, the connection layer 4mc of the connection part 4C has a function to well bond the gate pad GP of the semiconductor chip 2 with the stress buffer layer 4mb of the connection part 4C, and is well bonded and electrically connected to the gate pad GP. The description of the configurations of the connection layers 4ma and 4mc and the stress buffer layers 4mb of the connection parts 4B and 4C other than this will be omitted since they are the same as that described for the connection part 4A.

As described above, according to the first embodiment, the connection parts 4B and 4C are formed to have a layer-stacked structure of the connection layer 4ma, the stress buffer layer 4mb, and the connection layer 4mc. Therefore, the cost can be reduced in comparison with the case where the connection parts 4B and 4C are made of Au only. Particularly, when Cu or Ag is used as the high melting point metal of the connection layers 4ma and 4mc, the cost can be further reduced in comparison with the case where Au is used as the high melting point metal.

Also, even when the connection layers 4ma and 4mc of the connection parts 4B and 4C are a compound having hard and fragile properties, by providing the stress buffer layer 4mb between the connection layers 4ma and 4mc, the thermal stress which is generated due to the difference in the thermal expansion coefficient between the semiconductor chip 2 and the lead terminals 3SL and 3GL can be buffered by the stress buffer layer 4mb. Therefore, the problem that cracks are formed in the semiconductor chip 2 due to the thermal stress and the problem that breakage occurs in the connection parts 4B and 4C can be suppressed or prevented.

As shown in FIG. 9, the power transistor formed in this manner is mounted on a printed circuit board 15 of an electronic device by soldering together with other parts. The third portion 3DL3 of the drain lead terminal 3DL, the source lead terminal 3SL, and the gate lead terminal 3GL are electrically and mechanically connected to the electrodes 15a of the printed circuit board 15 by the above-mentioned conductive adhesive 16. More specifically, the power transistor of the first embodiment has a surface-mounting structure in which the third portion 3DL3 of the lead terminal 3DL, the lead terminal 3SL, and the lead terminal 3GL are disposed on the rear surface (second principal surface) of the sealing body 1. Particularly, in the first embodiment, since the lead terminals 3DL, 3SL, and 3GL are exposed from respectively different surfaces of the sealing body 1, solder fillets which are necessary for improving the reliability of solder connection in the soldering when the sealing body 1 is to be mounted can be readily formed, and check of the soldering quality by visual inspection can be readily performed. The adhesive 16 is made of, for example, a solder material having a Pb-free composition. Examples of the solder material having a Pb-free composition include Sn-3Ag-0.5Cu (tin-silver-copper, melting point: about 217° C.), Sn-9Zn (tin-zinc, melting point: about 199° C.), Sn-8Zn-3Bi (tin-zinc-bismuth, melting point: about 190° C.), Sn-3.5Ag-0.5Bi-8In (tin-silver-bismuth-indium, melting point: about 206° C.), and Sn-3Ag-0.5Cu-7In (tin-silver-copper-indium, melting point: about 206° C.).

Next, an example of the method of forming the connection parts 4A, 4B, and 4C will be described with reference to FIG. 10. Note that, since the configurations of the connection parts 4A, 4B, and 4C are the same as described above, the method of forming the connection part 4A will be shown as a representative, and the method of forming the connection parts 4B and 4C will be omitted.

Figure 10A:
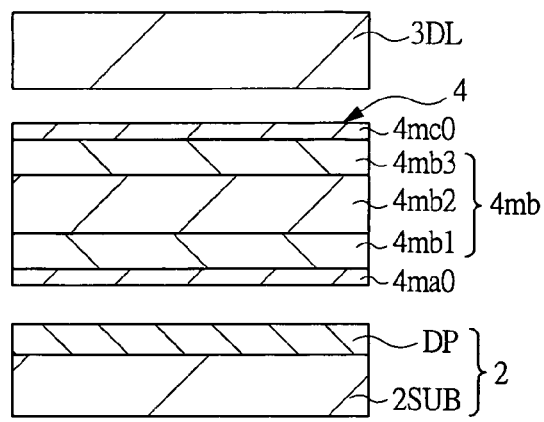
FIG. 10A is a cross-sectional view of a principal part of the members, which shows the state where metal foil for forming the connection part for connecting the drain lead terminal to the drain pad of the semiconductor chip is interposed between the drain lead terminal and the semiconductor chip 2 in the semiconductor device of FIG. 1.
Figure 10B:
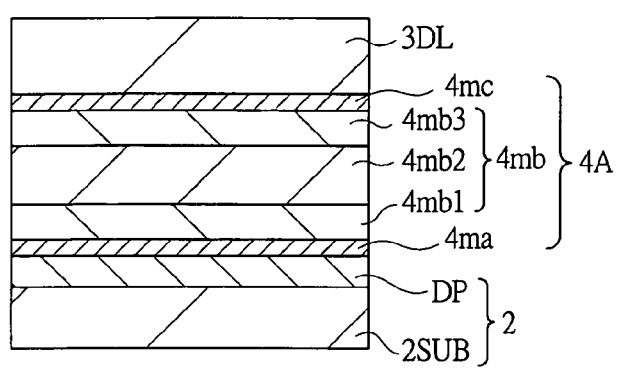
FIG. 10B is a cross-sectional view of a principal part showing the state after the members are bonded.

FIG. 10A is a cross-sectional view of the principal part of the members, which shows the state where metal foil (composite foil) 4 for forming the connection part 4A is interposed between the lead terminal 3DL and the semiconductor chip 2, and FIG. 10B is a cross-sectional view of a principal part showing the state after bonding the members.

The metal foil 4 of FIG. 10A has a stacked structure of three layers, that is, the stress buffer layer 4mb and metal layers 4ma0 and 4mc0 formed on the upper and lower surfaces thereof. The stress buffer layer 4mb of the metal foil 4 is composed of, for example, CIC. More specifically, the stress buffer layer 4mb is composed of, for example, metal layers having a three-layer stacked structure in which a metal layer 4mb1 made of Cu, a metal layer 4mb2 made of an invar alloy, and a metal layer 4mb3 made of Cu are sequentially stacked. Among these, the metal layers 4mb1 and 4bm3 serve also as the above-described high melting point metal which form the connection layer 4ma. The thickness of the stress buffer layer 4mb is, for example, about 100 μm. On the other hand, the metal layers 4ma0 and 4mc0 are a metal for forming the connection layers 4ma and 4mc, and are made of a low melting point (melting point is lower than 260° C.) Pb-free solder such as Sn. The metal layers 4ma0 and 4mc0 are formed by a sputtering method or a plating method, and the thickness of each of them is, for example, about 10 μm.

When forming the connection part 4A, first, as shown in FIG. 10A, after the metal foil 4 is disposed between the drain pad DP of the semiconductor chip 2 and the lead terminal 3DL, the drain pad DP and the metal layer 4ma0 of the metal foil 4 are brought into contact with each other, and the lead terminal 3DL and the metal layer 4mc0 of the metal foil 4 are brought into contact with each other. In this state, the metal foil 4 is sandwiched. Subsequently, in this state, the thermal treatment is performed in a gaseous atmosphere containing, for example, nitrogen (N$_2$) at 350° C. to 400° C. for about several minutes. Consequently, as shown in FIG. 10B, the metal of the metal layer 4ma0 of the metal foil 4 and metal of the metal layer 4mb1 of the stress buffer layer 4mb are reacted so that they are partially melted to form an integrated compound, thereby forming the connection layer 4ma between the stress buffer layer 4mb and the drain pad DP, and the metal of the metal layer 4mc0 of the metal foil 4 and the metal of the metal layer 4mb3 of the stress buffer layer 4mb are reacted so that they are partially melted to form an integrated compound, thereby forming the connection layer 4mc between the stress buffer layer 4mb and the lead terminal 3DL. In this case, the connection layers 4ma and 4mc are made of, for example, a Sn—Cu compound having a melting point of, for example, 260° C. or higher.

Second Embodiment

In a second embodiment, a case where a flexible metal material is used as the material of the stress buffer layer 4mb of the connection parts 4A, 4B, and 4C will be described. Note that, since the connection layers 4ma and 4mc of the connection parts 4A, 4B, and 4C are the same as that of the first embodiment, the description thereof will be omitted.

In the second embodiment, the stress buffer layer 4mb of the connection parts 4A, 4B, and 4C is a metal layer having yield stress of below 100 MPa, preferably, yield stress of 75 MPa or less. This is for the reason that, according to the examination results by the inventors of the present invention, when a material having yield stress of 100 MPa or more is used as the stress buffer layer, since thermal stress cannot be sufficiently buffered and large thermal stress is applied to the semiconductor chip 2, sometimes cracks are formed in the semiconductor chip 2. When, as is in the second embodiment, the stress buffer layer 4mb of the connection parts 4A, 4B, and 4C is composed of a metal layer having yield stress of below 100 MPa, even when thermal stress is generated in the connection parts 4A, 4B, and 4C, the stress buffer layer 4mb of the connection parts 4A, 4B, and 4C plastically deform. Therefore, it is possible to prevent the large stress from being applied to the semiconductor chip 2, and thus, cracks of the semiconductor chip can be suppressed or prevented. Moreover, in the case of the second embodiment, since the stress buffer layer 4mb is made of a soft material, the effect of buffering the stress can be obtained with a comparatively thin thickness. Therefore, it is possible to reduce the thickness of the stress buffer layer 4mb. Consequently, the thermal resistance of the connection parts 4A, 4B, and 4C having multi-layer structure can be reduced, and thus, the dissipation ability of the heat generated in the operation of the semiconductor chip 2 can be improved. Accordingly, the operation reliability of the power transistor can be improved. Effects other than these are the same as those of the first embodiment.

Figure 11:
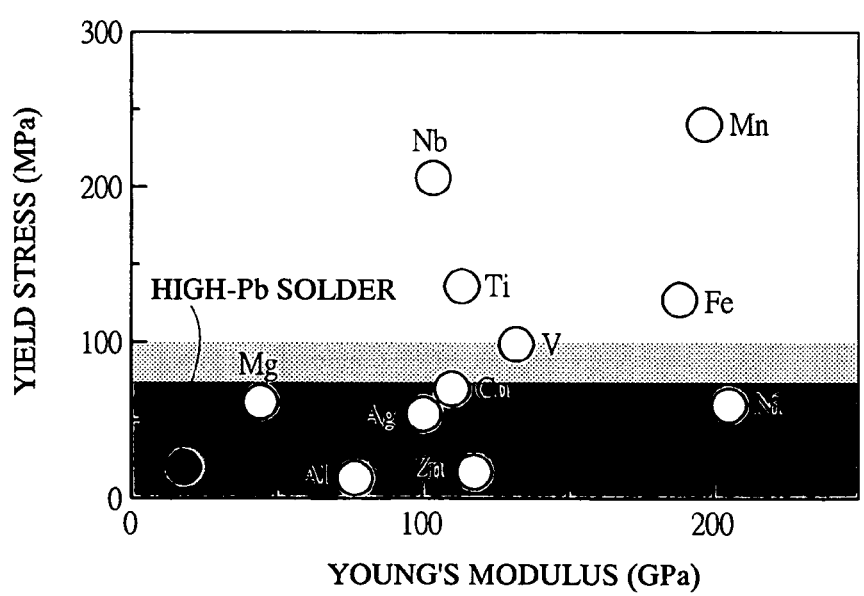
FIG. 11 is an explanatory drawing showing materials having conditions (yield stress and Young's modulus) suitable for a stress buffer layer.

FIG. 11 shows materials having conditions (yield stress and Young's modulus) suitable for the stress buffer layer. According to FIG. 11, the stress buffer layer 4mb is preferably composed of any one of the materials, for example, Al (aluminum), Mg (magnesium), Ag (silver), Zn (zinc), Cu (copper), and Ni (nickel). This is because, since these metals have lower yield stress than Au-20Sn and are readily plastically deformed, they effectively function as the above-described buffer material of thermal stress. Although such stress buffer function does not largely depend on the Young's modulus of the material, the material preferably has a small Young's modulus. Also, in the second embodiment, the thickness of the stress buffer layer 4mb is, for example, preferably about 30 µm to 200 µm. When the thickness is less than 30 µm, since the thermal stress cannot be sufficiently buffered, cracks are sometimes formed in the semiconductor chip 2. On the other hand, when the thickness is 200 µm or more, since the thermal expansion coefficients of Al, Mg, Ag, and Zn are larger than that of the lead terminals 3DL, 3SL, and 3GL made of Cu, effects of the thermal expansion efficient become large, and sometimes cracks are formed in the semiconductor chip 2.

Also in the second embodiment, for the same reason described in the first embodiment, the stress buffer layer 4mb of the connection parts 4A, 4B, and 4C has a melting point (for example, 260° C. or higher, for the same reason as the first embodiment) higher than the melting point of the adhesive 16 which is used to connect the lead terminals 3DL, 3SL, and 3GL to the electrodes 15a of the printed circuit board 15 when the sealing body 1 is to be mounted on the printed circuit board.

Next, an example of the method for forming the connection parts 4A, 4B, and 4C in the second embodiment will be described with reference to FIG. 12. Note that, also in the second embodiment, the formation method of the connection part 4A is shown as a representative, and the formation method of the connection parts 4B and 4C will be omitted.

Figure 12A:
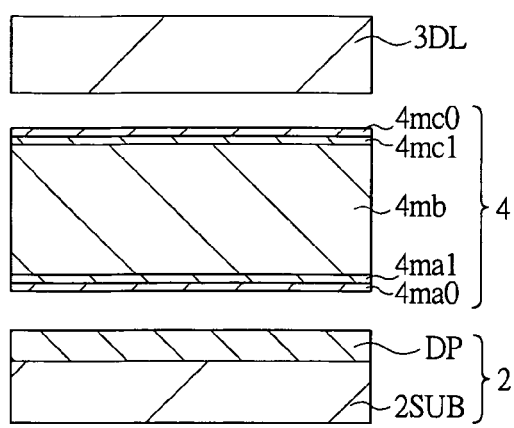
FIG. 12A is a cross-sectional view of a principal part of the members, which shows the state where the metal foil for forming the connection part is interposed between the lead terminal and the semiconductor chip in a semiconductor device of another embodiment of the present invention.
Figure 12B:
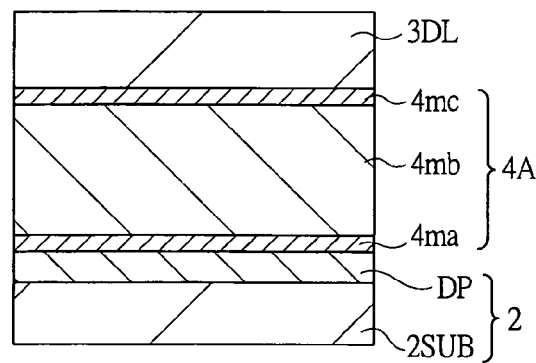
FIG. 12B is a cross-sectional view of a principal part showing the state after the members are bonded.

FIG. 12A is a cross-sectional view of the principal part of the members, which shows the state where the metal foil 4 for forming the connection part 4A is interposed between the lead terminal 3DL and the semiconductor chip 2 according to the second embodiment. FIG. 12B is a cross-sectional view of a principal part, which shows the state after the members are bonded.

The metal foil 4 of FIG. 12A has a layer stacked structure of five layers, i.e., the stress buffer layer 4mb, a metal layer 4ma1 stacked on the upper surface thereof, a metal layer 4ma0 further stacked thereon, a metal layer 4mc1 stacked on the lower surface of the stress buffer layer 4mb, and a metal layer 4mc0 further stacked below it.

The stress buffer layer 4mb of the metal foil 4 is made of a flexible metal such as Al, and the thickness thereof is, for example, about 100 µm. On the other hand, the metal layers 4ma0 and 4ma1 are metals for forming the connection layer 4ma, and the metal layers 4mc0 and 4mc1 are metals for forming the connection layer 4mc. The metal layers 4ma1 and 4mc1 which are in contact with the stress buffer layer 4mb are made of a high melting point metal such as Cu. The metal layers 4ma0 and 4mc0 which are in contact with the metal layers 4ma1 and 4mc1 are made of a Pb-free solder having a low melting point (melting point is lower than 260° C.) such as Sn. The combined thickness of the metal layers 4ma0 and 4ma1 and the combined thickness of the metal layers 4mac0 and 4mc1 are, for example, about 10 µm. The thicknesses of the metal layers 4ma0, 4ma1, 4mc0, and 4mc1 are preferably set to the thicknesses corresponding to the amounts that will not cause the low melting point metal to remain in a single phase when the high melting point metal of the metal layers 4ma1 and 4mc1 and the low melting point metal of the metal layers 4ma0 and 4mc0 are reacted so as to form intermetallic compounds. This is because, if it is in the state that will cause the low melting point metal phase to remain, the low melting point metal will melt again at the thermal treatment temperature (reflow temperature: 260° C.) when the sealing body 1 is to be mounted on the printed circuit board 15, which may lead to the generation of solder flash. All of these metal layers 4ma1, 4mc1, 4mc0, and 4mc1 are formed by a sputtering method, a plating method, or the like.

Also in the case of the second embodiment, the formation method and conditions of the connection part 4A are approximately the same as that of the first embodiment described with reference to FIG. 10. In the case of the second embodiment, when thermal treatment which is similar to that described above is carried out, as shown in FIG. 12B, the metal of the metal layer 4ma0 and the metal of the metal layer 4ma1 of the metal foil 4 are reacted so that the metals are melted and formed into an integrated compound, thereby forming the connection layer 4ma between the stress buffer layer 4mb and the drain pad DP, and also, the metal of the metal layer 4mc0 and the metal of the metal layer 4mc1 of the metal foil 4 are reacted so that the metals are melted and formed into an integrated compound, thereby forming the connection layer 4mc between the stress buffer layer 4mb and the lead terminal 3DL. In this case, the connection layers 4ma and 4mc are formed of, for example, a compound of Sn—Cu having a high melting point of, for example, 260° C. or higher.

Third Embodiment

In a third embodiment, a case where a high melting point Pb-free solder is used as the material of the connection layers 4ma and 4mc of the connection parts 4A, 4B, and 4C will be described. Note that, since the stress buffer layer 4mb of the connection parts 4A, 4B, and 4C is the same as that of the first embodiment, the description thereof will be omitted.

In the third embodiment, the connection layers 4ma and 4mc of the connection parts 4A, 4B, and 4C are made of, for example, a high melting point Pb-free solder having a melting point (for example, 260° C. or higher and 400° C. or lower) higher than the melting point of the adhesive 16. More specifically, the connection layers 4ma and 4mc are made of any one of an Au—Sn (gold-tin)-based alloy, an Au—Ge (gold-germanium)-based alloy, an Au—Si (gold-silicon)-based alloy, a Zn—Al (zinc-aluminum)-based alloy, a Zn—Al—Ge (zinc-aluminum-germanium)-based alloy, Bi (bismuth), a Bi—Ag (bismuth-silver)-based alloy, a Bi—Cu (bismuth-copper)-based alloy, and a Bi—Ag—Cu (bismuth-silver-copper)-based alloy. Accordingly, since voids are hardly formed in the connection parts 4A, 4B, and 4C, the thermal resistance and the electrical resistance can be reduced, and the reliability of the power transistor can be improved. Note that the reason for setting the uppermost limit of the melting point of the high melting point Pb-free solder at 400° C. is that, when connection is made by the process at 400° C. or higher, the lead terminals (lead frame) made of copper are softened.

Incidentally, when the connection parts 4A, 4B, and 4C are made of only the high melting point Pb-free solder, since high melting point Pb-free solders have hard and fragile properties, cracks are formed in the semiconductor chip 2 or the connection parts 4A, 4B, and 4C are broken sometimes due to the thermal stress. In addition, when Au is contained, there is also a problem in terms of cost. On the other hand, in the third embodiment, since the stress buffer layer 4mb is provided in the connection parts 4A, 4B, and 4C, cracks in the semiconductor chip 2 and breakage of the connection parts 4A, 4B, and 4C can be suppressed or prevented even when a high melting point Pb-free solder having hard and fragile properties is used as the material of the connection layers 4ma and 4mc. Moreover, by providing the stress buffer layer 4mb, the thickness of the connection layers 4ma and 4mc can be reduced. Therefore, even when a material containing Au is used as the material of the connection layers 4*ma* and 4*mc*, the cost can be reduced in comparison with a case where the entire connection parts 4A, 4B, and 4C are made of a high melting point Pb-free solder.

Next, an example of the formation method of the connection parts 4A, 4B, and 4C of the third embodiment will be described with reference to FIG. 13. Note that, also in the third embodiment, the formation method of the connection part 4A is shown as a representative, and the formation method of the connection parts 4B and 4C will be omitted.

Figure 13A:
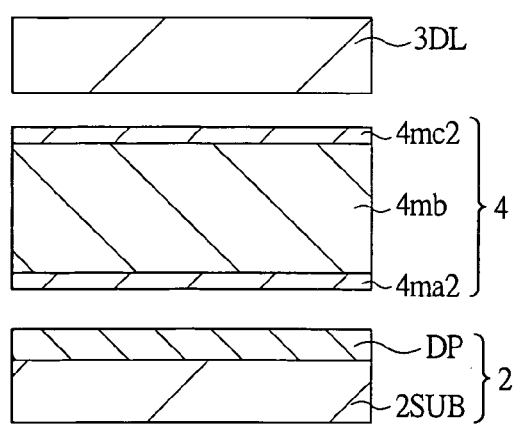
FIG. 13A is a cross-sectional view of a principal part of members, which shows the state where the metal foil for forming the connection part is interposed between the lead terminal and the semiconductor chip in a semiconductor device of another embodiment of the present invention.
Figure 13B:
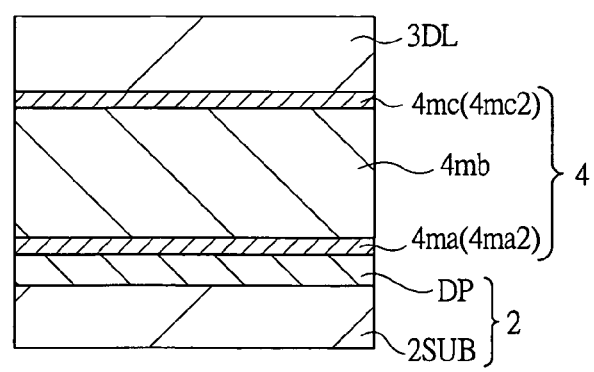
FIG. 13B is a cross-sectional view of a principal part showing the state after the members are bonded.

FIG. 13A is a cross-sectional view of a principal part of the members, which shows the state where the metal foil 4 for forming the connection part 4A is interposed between the lead terminal 3DL and the semiconductor chip 2 according to the third embodiment. FIG. 13B is a cross-sectional view of a principal part, which shows the state after the members are bonded.

The metal foil 4 of FIG. 13A has a stacked structure of three layers, i.e., the stress buffer layer 4*mb* and metal layers 4*ma*2 and 4*mc*2 stacked on the upper and lower surfaces thereof.

The stress buffer layer 4*mb* of the metal foil 4 is made of a metal such as the above-described CIC, and the thickness thereof is, for example, about 100 μm. On the other hand, the metal layers 4*ma*2 and 4*mc*2 are made of, for example, Au-2OSn (melting point: 278° C.), and the thickness thereof is, for example, about 20 μm. Both the connection layers 4*ma*2 and 4*mc*2 are formed by a sputtering method, a plating method, or the like.

Also in the case of the third embodiment, the formation method and conditions of the connection part 4A are approximately the same as that described in the first embodiment with reference to FIG. 10. In the third embodiment, when thermal treatment similar to that described above is carried out, as shown in FIG. 13B, the metal layer 4*ma*2 (that is, the connection layer 4*ma*) of the metal foil 4 is connected to the drain pad DP, and the metal layer 4*mc*2 (that is, connection layer 4*mc*) of the metal foil 4 is connected to the lead terminal 3DL, thereby forming the connection part 4A.

Fourth Embodiment

In a fourth embodiment, a case where a high melting point Pb-free solder similar to that described in the third embodiment is used as the material of the connection layers 4*ma* and 4*mc* of the connection parts 4A, 4B, and 4C, and a flexible metal similar to that described in the second embodiment is used as the material of the stress buffer layer 4*mb* will be described.

In the fourth embodiment, the connection layers 4*ma* and 4*mc* of the connection parts 4A, 4B, and 4C are made of any one of an Au—Sn-based alloy, an Au—Ge-based alloy, an Au—Si-based alloy, a Zn—Al-based alloy, a Zn—Al—Ge-based alloy, Bi, a Bi—Ag-based alloy, a Bi—Cu-based alloy, and a Bi—Ag—Cu-based alloy. Accordingly, voids are hardly formed in the connection parts 4A, 4B, and 4C. Therefore, the thermal resistance and the electrical resistance can be reduced, and the reliability of the power transistor can be improved.

Moreover, the stress buffer layer 4*mb* of the connection parts 4A, 4B, and 4C is made of any one of, for example, Al, Mg, Ag, Zn, Cu, and Ni. Accordingly, even when thermal stress is generated in the connection part 4A, 4B, and 4C, the stress buffer layer 4*mb* of the connection part 4A, 4B, and 4C plastically deforms. Therefore, it is possible to prevent large stress from being applied to the semiconductor chip 2, and thus, cracks of the semiconductor chip 2 and breakage of the connection parts 4A, 4B, and 4C can be suppressed or prevented even when a high melting point Pb-free solder having hard and fragile properties is used as the material of the connection layers 4*ma* and 4*mc*. Moreover, in the case of the fourth embodiment, similar to the second embodiment, since the thickness of the stress buffer layer 4*mb* can be reduced, the thermal resistance of the connection parts 4A, 4B, and 4C having a multi-layer structure can be reduced. Accordingly, dissipation ability of heat generated during the operation of the semiconductor chip 2 can be improved. Therefore, the reliability of the operation of the power transistor can be improved. Furthermore, since the thickness of the connection layers 4*ma* and 4*mc* can be reduced by providing the stress buffer layer 4*mb*, even when a material containing Au is used as the material of the connection layers 4*ma* and 4*mc*, the cost can be reduced in comparison with the case where the entire connection parts 4A, 4B, and 4C are made of a high melting point Pb-free solder.

Note that, since the formation method of the connection parts 4A, 4B, and 4C of the fourth embodiment is the same except that the material of the stress buffer layer 4*mb* of the third embodiment is changed, the description thereof will be omitted.

Fifth Embodiment

For example, in the first to fourth embodiments, the cases where the materials of the connection layers 4*ma* and 4*mc* of the connection parts 4A to 4C are the same, and the materials of the stress buffer layers 4*mb* of the connection parts 4A to 4C are the same have been described. However, the materials are not limited thereto, and various modifications can be made and different materials can be used depending on the parts.

For example, in current experiments, when Sn serving as a low melting point metal and Cu serving as a high melting point metal are used as the intermetallic compound for the connection layers 4*ma* and 4*mc* which are formed by reaction of a high melting point metal with a Pb-free solder, it has been confirmed that Cu—Sn compounds (Cu6Sn5, Cu3Sn) and Cu—Ni—Sn compounds are formed on the semiconductor chip 2 side, and Cu—Sn compounds (Cu6Sn5, Cu3Sn) are formed on the Cu frame (lead terminals 3DL, 3SL, and 3GL) side.

As the phases formed by Cu+Sn-3Ag-0.5Cu, phases of Cu—Sn-compounds (Cu6Sn5, Cu3Sn), an Ag—Sn compound (Ag3Sn), and a Cu—Ni—Sn compound have been confirmed on the semiconductor chip 2 side, and phases of Cu—Sn compounds (Cu6Sn5, Cu3Sn), an Ag—Sn compound (Ag3Sn) have been confirmed on the Cu frame (lead terminals 3DL, 3SL, and 3GL) side.

As the phases formed by Cu+Sn-6Zn, phases of Cu—Sn compounds (Cu6Sn5, Cu3Sn) and a Cu—Zn compound have been confirmed on the semiconductor chip 2 side, and phases of a Cu—Zn compound and Cu—Sn compounds (Cu6Sn5, Cu3Sn) have been confirmed on the Cu frame (lead terminals 3DL, 3SL, and 3GL) side.

As the phases formed by Au+Sn, a phase of an Au—Sn compound has been confirmed on the semiconductor chip 2 side, and phases of an Au—Sn compound and Cu—Sn compounds (Cu6Sn5, Cu3Sn) have been confirmed on the Cu frame (lead terminals 3DL, 3SL, and 3GL) side.

As the phases formed by Ni+Sn, a phase of an Ni—Sn compound has been confirmed on the semiconductor chip 2 side, and phases of an Ni—Sn compound, Cu—Sn compounds (Cu6Sn5, Cu3Sn), and an Ni—Cu—Sn compound have been confirmed on the Cu frame (lead terminals 3DL, 3SL, and 3GL) side.

As the phases formed by Ag+Sn, a phase of an Ag—Sn compound (Ag3Sn) and an Ag-rich hcp phase have been confirmed on the semiconductor chip 2 side, and a phase of an Ag—Sn compound (Ag3Sn), an Ag-rich hcp phase, and Cu—Sn compound (Cu6Sn5, Cu3Sn) phases have been confirmed on the Cu frame (lead terminals 3DL, 3SL, and 3GL) side.

As the phases formed by Cu+In-48Sn, phases of Cu—Sn compounds (Cu6Sn5, Cu3Sn), an In—Cu compound, an In—Sn—Cu compound have been confirmed on the semiconductor chip 2 side, and phases of Cu—Sn compounds (Cu6Sn5, Cu3Sn), an In—Cu compound, and an In—Sn—Cu compound have been confirmed on the Cu frame (lead terminals 3DL, 3SL, and 3GL) side.

As the phases formed by Ag+Bi-43Sn, an Ag—Sn compound (Ag3Sn) phase, an Ag-rich hcp phase, and a Bi phase have been confirmed on the semiconductor chip 2 side, and an Ag—Sn compound (Ag3Sn) phase, an Ag-rich hcp phase, a Bi phase, and Cu—Sn compound (Cu6Sn5, Cu3Sn) phases have been confirmed on the Cu frame (lead terminals 3DL, 3SL, and 3GL) side.

Sixth Embodiment

Figure 14:
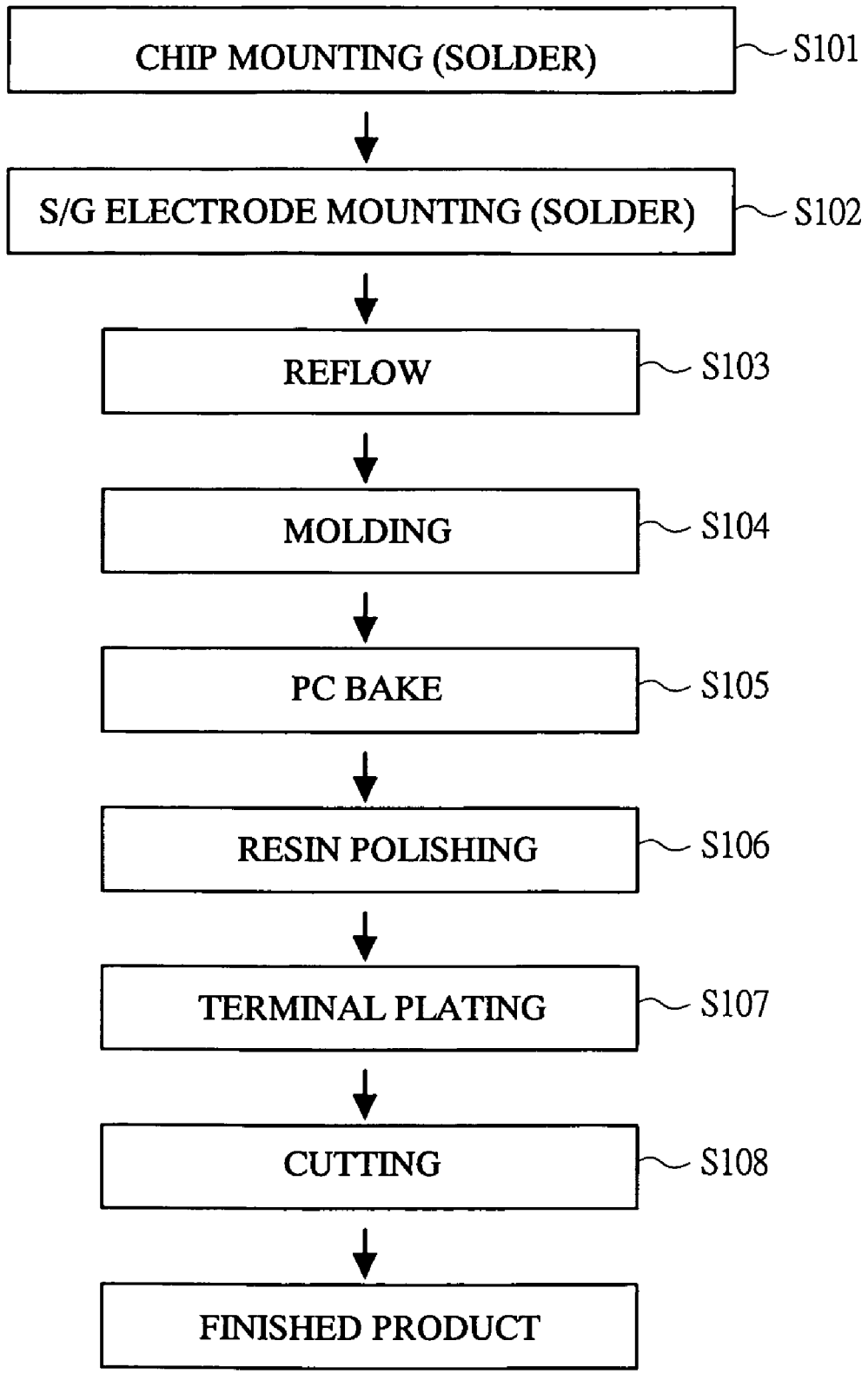
FIG. 14 is a manufacturing flow diagram of the semiconductor device of an embodiment of the present invention.
Figure 15A:
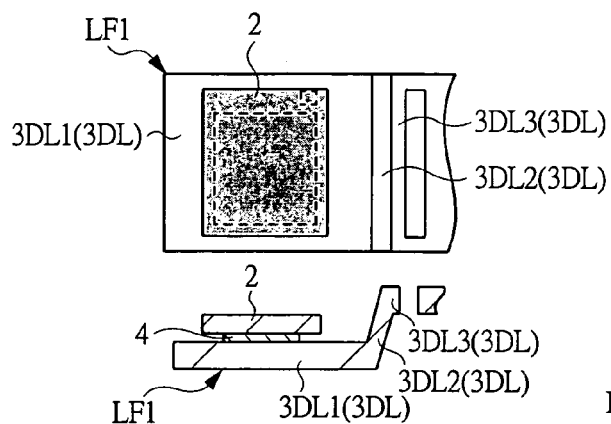
FIG. 15A is an explanatory drawing showing the manufacturing process of the semiconductor device in an embodiment of the present invention.
Figure 15B:
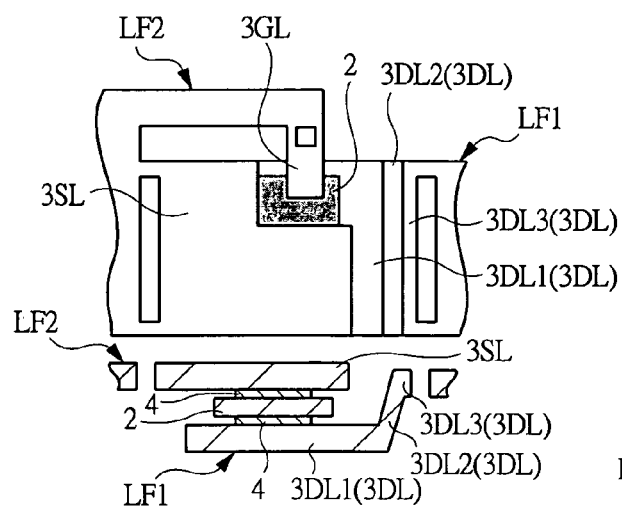
FIG. 15B is an explanatory drawing showing the manufacturing process of the semiconductor device in an embodiment of the present invention.
Figure 15C:
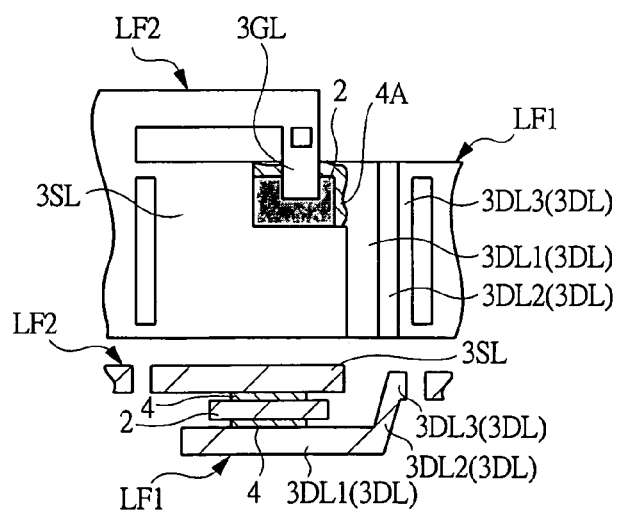
FIG. 15C is an explanatory drawing showing the manufacturing process of the semiconductor device in an embodiment of the present invention.
Figure 15D:
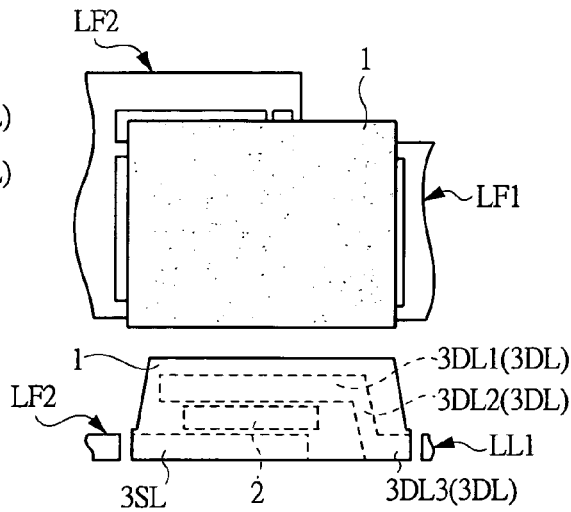
FIG. 15D is an explanatory drawing showing the manufacturing process of the semiconductor device in an embodiment of the present invention.
Figure 15E:
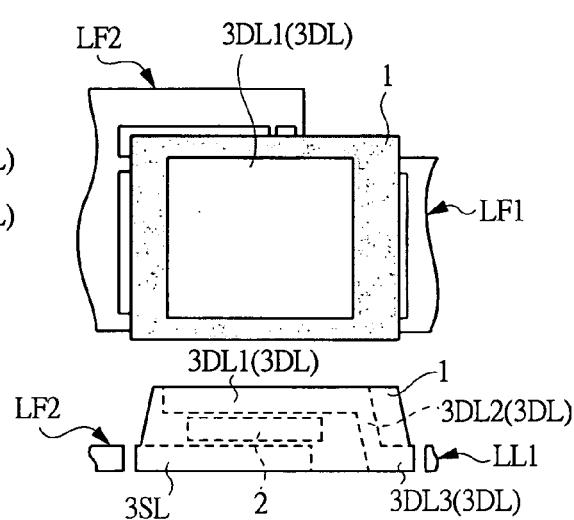
FIG. 15E is an explanatory drawing showing the manufacturing process of the semiconductor device in an embodiment of the present invention.
Figure 15F:
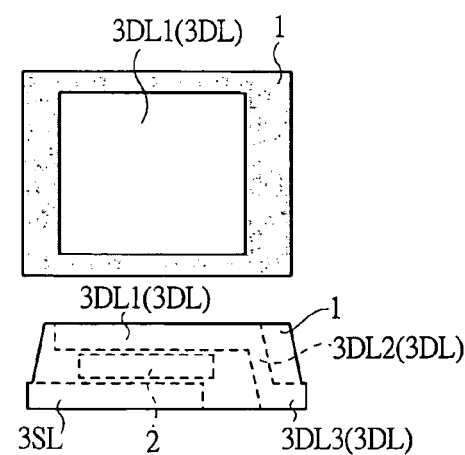
FIG. 15F is an explanatory drawing showing the manufacturing process of the semiconductor device in an embodiment of the present invention.

In a sixth embodiment, an example of a manufacturing method of the power transistors of the first to fifth embodiments will be described with reference to FIG. 14 and FIG. 15A to FIG. 15F. FIG. 14 is a manufacturing flow diagram of the power transistor, and FIG. 15A to FIG. 15F are explanatory drawings showing the manufacturing process of the power transistor. The upper parts of FIG. 15A to FIG. 15F are plan views of a unit power transistor region, the lower parts of FIG. 15A to FIG. 15C are cross-sectional views taken along the X1-X1 lines of the respective upper parts, and the lower parts of FIG. 15D to FIG. 15F are side views of the respective upper parts.

First, in the manufacture of the power transistors, first and second lead frames LF1 and LF2 and the semiconductor chip 2 are prepared.

The first and the second lead frames LF1 and LF2 are formed of copper alloy plates having a thickness of, for example, about 0.2 mm. On the first lead frame LF1, a plurality of the lead terminals 3DL integrally connected with each other are repeatedly disposed. Each lead terminal 3DL is a part to which one semiconductor chip 2 is to be connected, and has the above-described bent structure at this point. On the second lead frame LF2, a plurality units of the lead terminals 3SL and 3GL integrally connected with each other are repeatedly disposed. The source pad SP and the gate pad GP are exposed on the principal surface of the semiconductor chip 2, and the drain pad DP is exposed on the rear surface of the semiconductor chip 2.

Subsequently, as shown in FIG. 15A, the semiconductor chip 2 is mounted on the chip mounting surface of the first portion 3DL1 of the lead terminal 3DL of the first lead frame LF1 via the metal foil 4 (S101 of FIG. 14). At this time, one of the principal surfaces of the metal foil 4 is in contact with the chip mounting surface of the lead terminal 3DL, and the other principal surface of the metal foil 4 which is on the opposite side of the above-described principal surface is in contact with the drain pad DP of the rear surface (first principal surface) of the semiconductor chip 2. However, these members are not connected to each other at this point.

Subsequently, as shown in FIG. 15B, the lead terminals 3SL and 3GL of the second lead frame LF2 are mounted on the principal surface (second principal surface) of the semiconductor chip 2 via the metal foil 4 in the same manner as that described above (S102 of FIG. 14). They are mounted so that the lead terminal 3SL is opposed to the source pad SP of the semiconductor chip 2 and the distal end of the lead terminal 3GL is opposed to the gate pad GP of the semiconductor chip 2. Also at this time, the members are not connected to each other. Note that the above-described process is performed on a plurality of unit regions of the first and second lead frames LF1 and LF2.

Then, the resulting structure is subjected to reflow (thermal treatment), for example, in a $N_2$+15% $H_2$ gas atmosphere at 350 to 400° C. for 3 to 10 minutes. By doing so, as shown in FIG. 15C, in each unit region, the drain pad DP of the semiconductor chip 2 and the lead terminal 3DL are connected to each other via the connection part 4A, the source pad SP of the semiconductor chip 2 and the lead terminal 3SL are connected to each other via the connection part 4B, and the gate pad GP of the semiconductor chip 2 and the lead terminal 3GL are connected to each other via the connection part 4C (S103 of FIG. 14).

Then, as shown in FIG. 15D, the sealing body 1 is formed (S104 of FIG. 14). More specifically, the sealing body 1 is formed by covering the lead frames LF1 and LF2, the semiconductor chip 2, and the connection parts 4A, 4B, and 4C with insulating resin so that portions of the external surfaces of the lead terminals 3DL, 3SL, and 3GL of the first and second lead frames LF1 and LF2 are exposed. In this process of forming the sealing body 1, after the assembled lead frames LF1 and LF2 and others are clamped between a lower mold and an upper mold of forming molds of transfer molding equipment, the insulating resin is injected from gates of the transfer molding equipment into cavities thereof, and the insulating resin is cured by post cure bake (S105 of FIG. 14).

The sealing body 1 is a rectangular prism having four side surfaces. Ends of the lead terminals 3DL, 3SL, and 3GL are protruding from mutually different three side surfaces of the sealing body 1, respectively. Therefore, in the transfer molding, the lead terminals 3DL and 3SL are protruding from both sides or both ends of the cavities of the forming molds, and the lead terminals 3DL and 3SL are reliably clamped by the lower mold and the upper mold. As a result, the lead terminals 3DL, 3SL, and 3GL are firmly adhered to a sheet on the bottom surface or ceiling surface side of the cavities, and thus, the resin does not leak out to the exposed surfaces of the lead terminals 3DL, 3SL, and 3GL which are exposed to the outside. Moreover, at this point, when the resin of the sealing body 1 is sealed to be a little thicker than the upper and lower lead frames LF1 and LF2, chip cracks and solder cracks due to mold clamping can be suppressed.

Then, the resin of the sealing body 1 protruding above and below is removed by a method such as liquid honing. By doing so, the upper surface of the lead terminal 3DL and the lower surfaces of the lead terminals 3SL and 3GL are exposed to the outside of the sealing body 1 as shown in FIG. 15E (S106 of FIG. 14). Subsequently, by performing the plating process, plating films for mounting are formed on the surfaces of the lead terminals 3DL, 3SL, and 3GL which are exposed from the sealing body 1 (S107 of FIG. 14). For example, SnBi films are formed as the plating films. Then, unnecessary portions of the lead frames LF1 and LF2 are removed by cutting (S108 of FIG. 14), thereby manufacturing the power transistor as shown in FIG. 1, FIG. 2, FIG. 4, FIG. 5 and others. FIG. 15F is a drawing showing the state where the unnecessary portions of the lead frames LF1 and LF2 have been removed by cutting. More specifically, FIG. 15F is a drawing in which the connecting parts between one ends of the lead terminals 3DL, 3SL, and 3GL and the lead frames LF1 and LF2 have been removed by cutting. The distal ends of the lead terminals 3DL, 3SL, and 3GL are slightly protruding by about 0.1 to 0.2 mm from the side surfaces of the sealing body 1. The lead terminals 3DL, 3SL, and 3GL are to be drain, source, and gate electrode terminals, respectively.

Seventh Embodiment

In a seventh embodiment, an example of a manufacturing method of the power transistors of the first to fifth embodiments, in which the metal foil 4 for forming the connection parts 4A to 4C are bonded by scrubbing will be described.

As a method for bonding the metal foil 4, a method employing a scrubbing method is known. In this method, while pressing one of the principal surfaces of the metal foil 4 against a member to be bonded and applying desired heat thereto, the metal foil 4 is vibrated in the direction horizontal to the bonding surface of the member to be bonded. By doing so, the metal foil is bonded with the member to be bonded. When this scrubbing method is employed, the ability of eliminating voids between the metal foil 4 and the member to be bonded can be improved.

However, when this method is used to bond the metal foil 4, the metal layer of the other principal surface of the metal foil 4 which is on the opposite side of the principal surface which comes into contact with the member to be bonded melts, and a compound of the metal layer is formed. As a result, the bonding becomes difficult if another bonding member is to be bonded to the side of the metal layer. Therefore, there is anxiety for employing the scrubbing method.

Therefore, in the seventh embodiment, the metal layers of the upper and lower principal surfaces of the metal foil 4 are made of materials having different melting points. More specifically, in the metal foil 4, the melting point of the metal layer on the side that is bonded first is set to be lower than the melting point of the metal layer on the side that is bonded subsequently. Consequently, after one of the principal surfaces of the metal foil 4 is bonded to the member to be bonded by a scrubbing method, the other bonding member can be well bonded to the other principal surface of the metal foil 4. In addition, since the scrubbing method can be employed, the ability of eliminating voids between the metal foil 4 and the member to be bonded can be improved, and voids can be reduced.

Next, an example of the method of manufacturing the power transistor of the seventh embodiment will be described with reference to FIG. 16A to FIG. 19B.

Figure 16A:
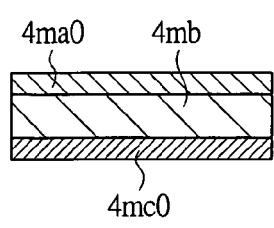
FIG. 16A is a cross-sectional view showing a principal part of the example of the metal foil used in the manufacture of the semiconductor device in an embodiment of the present invention.
Figure 16B:
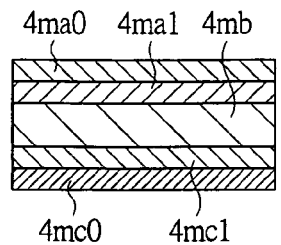
FIG. 16B is a cross-sectional view showing a principal part of the example of the metal foil used in the manufacture of the semiconductor device in an embodiment of the present invention.
Figure 16C:
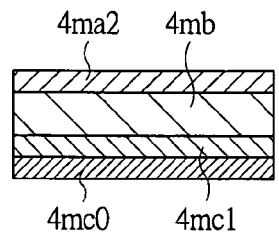
FIG. 16C is a cross-sectional view showing a principal part of the example of the metal foil used in the manufacture of the semiconductor device in an embodiment of the present invention.

First, FIG. 16A to FIG. 16C are cross-sectional views showing principal parts of examples of the metal foil 4. In the metal foil 4 of FIG. 16A, the metal layers 4$ma$0 and 4$mc$0 are formed of the reactive Pb-free solders described in the first and second embodiments, and the stress buffer layer 4$mb$ is formed of the material described in the first embodiment. However, the melting point of the metal layer 4$mc$0 of the metal foil 4 is lower than the melting point of the metal layer 4$ma$0. More specifically, the material of the metal layer 4$mc$0 is, for example, Sn—In-based Sn-51In (melting point: 120° C.) or Sn—Zn-based Sn-9Zn (melting point: 198.5° C.), and the material of the metal layer 4$ma$0 is, for example, Sn-based Sn (melting point: 232° C.) or Sn—Ag-based Sn-3.5Ag (melting point: 221° C.). Other than these, the material of the metal layer 4$mc$0 can be selected from, for example, In-based, Sn—Zn—Bi-based, In—Ag-based, and In—Cu-based materials, and the material of the metal layer 4$ma$0 having a melting point higher than that can be selected from, for example, Sn—Cu-based, Sn—Ag—Cu-based, Bi—Sn-based, and Bi—In based materials.

In the metal foil 4 of FIG. 16B, the metal layers 4$ma$0 and 4$mc$0 are formed of the reactive Pb-free solder described in the first and second embodiments, the metal layers 4$ma$1 and 4$mc$1 are formed of the high melting point metal described in the second embodiment, and the stress buffer layer 4$mb$ is formed of the flexible metal material described in the second and fourth embodiments. However, the melting point of the metal layer 4$mc$0 of the metal foil 4 is lower than the melting point of the metal layer 4$ma$0. Specific examples of the materials of the metal layers 4$ma$0 and 4$mc$0 are the same as those described in FIG. 16A.

In the metal foil 4 of FIG. 16C, the metal layer 4$mc$0 is formed of the reactive Pb-free solder described in the first and second embodiments, the metal layer 4$mc$1 is formed of the high melting point metal described in the second embodiment, the metal layer 4$ma$2 is formed of the high melting point Pb-free solder described in the third and fourth embodiments, and the stress buffer layer 4$mb$ is formed of the flexible metal material described in the second and fourth embodiments. In this case, the melting point of the metal layer 4$mc$0 of the metal foil 4 is lower than the melting point of the metal layer 4$ma$2. The specific example of the material of the metal layer 4$mc$0 is the same as that described in the first and second embodiments, and the specific example of the material of the metal layer 4$ma$2 is the same as that described in the third and fourth embodiments.

Figure 17A:
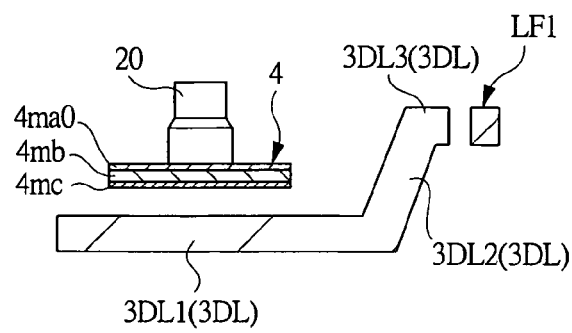
FIG. 17A is a cross-sectional view showing the principal part of the manufacturing process of the semiconductor device in an embodiment of the present invention.
Figure 17B:
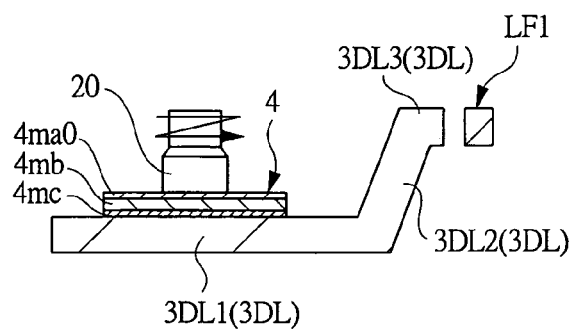
FIG. 17B is a cross-sectional view showing the principal part of the manufacturing process of the semiconductor device in an embodiment of the present invention.
Figure 17C:
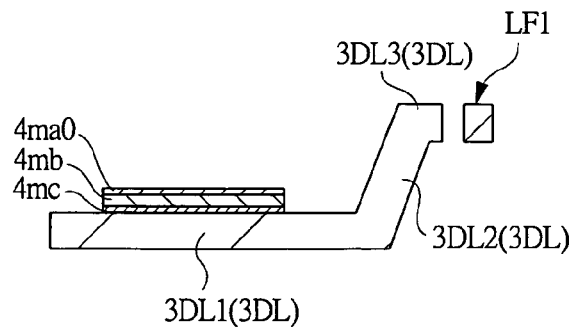
FIG. 17C is another cross-sectional view showing the principal part of the manufacturing process of the semiconductor device in an embodiment of the present invention.

Subsequently, as shown in FIG. 17A, the first lead frame LF1 is placed on a mounter for mounting the metal foil, and then, heating is started. The atmosphere of the processing chamber herein is a gaseous atmosphere containing nitrogen ($N_2$). Subsequently, the metal foil 4 (hereinafter, the metal foil 4 of FIG. 16A will be shown as an example) is vacuum-sucked by a vacuum suction nozzle 20, and transported to a position immediately above the chip mounting surface of the first portion 3DL1 of the lead terminal 3DL of the lead frame LF1. At this time, the upper surface of the metal layer 4$ma$0 of the metal foil 4 is in contact with a suction surface of the vacuum suction nozzle 20, and the lower surface of the metal layer 4$mc$0 of the metal foil 4 is opposed to the chip mounting surface of the first portion 3DL1 of the lead terminal 3DL. Subsequently, after aligning the planar positions of the metal foil 4 and the first portion 3DL1 of the lead terminal 3DL, the metal foil 4 is bonded to the lead terminal 3DL by the scrubbing method. More specifically, as shown in FIG. 17B, by lowering the vacuum suction nozzle 20, the metal foil 4 is pressed against the lead terminal 3DL of the first lead frame LF1 with a desired pressure, and in this state, the metal foil 4 is vibrated in the direction horizontal to the chip mounting surface of the lead terminal 3DL, thereby bonding the metal foil 4 to the lead terminal 3DL as shown in FIG. 17C. The heat treatment temperature in this case is a temperature at which the metal layer 4$mc$0 of the metal foil 4 melts and the metal layer 4$ma$0 thereof does not melt. Consequently, only the metal layer 4$mc$0 of the metal foil 4 melts, and the above-described compound is formed so that the connection layer 4$mc$ is formed and the metal foil 4 is firmly bonded to the lead terminal 3DL. Meanwhile, the metal layer 4$ma$0 of the metal foil 4 neither melts nor is converted into a compound. Since the metal foil 4 can be bonded to the lead terminal 3DL by the scrubbing method in this manner, the ability of eliminating voids between the metal foil 4 and the lead terminal 3DL can be improved.

Figure 18A:
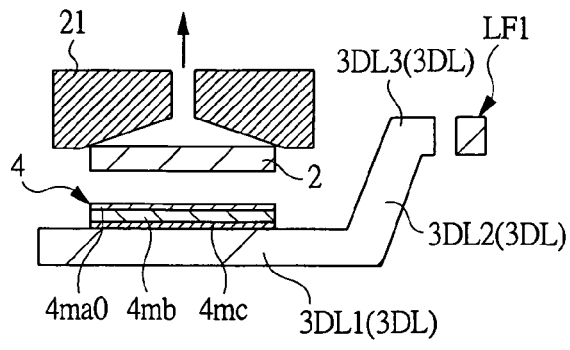
FIG. 18A is a cross-sectional view showing the principal part in the manufacturing process of the semiconductor device subsequent to that of FIG. 17C.
Figure 18B:
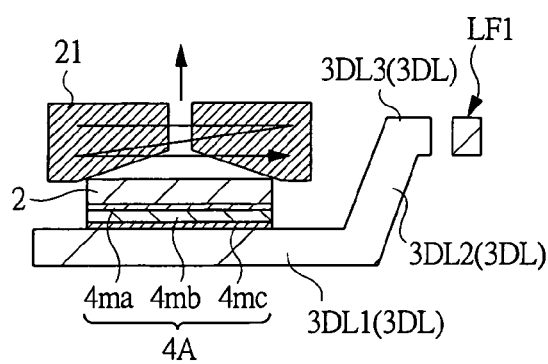
FIG. 18B is a cross-sectional view showing the principal part in the manufacturing process of the semiconductor device subsequent to that of FIG. 18A.
Figure 18C:
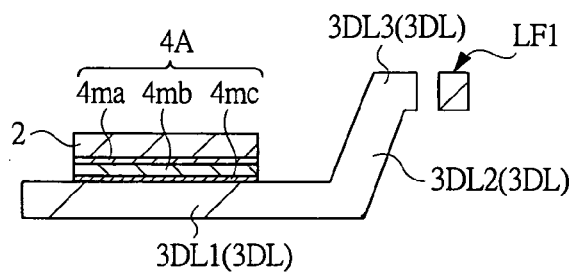
FIG. 18C is a cross-sectional view showing the principal part in the manufacturing process of the semiconductor device subsequent to that of FIG. 18B.

Subsequently, as shown in FIG. 18A, the semiconductor chip 2 is vacuum sucked by a pyramidal collet 21, and transported to a position immediately above the metal foil 4 which is bonded to the lead terminal 3DL of the lead frame LF1. At this point, the drain pad DP of the rear surface (first principal surface) of the semiconductor chip 2 is opposed to the metal layer 4ma of the metal foil 4. Subsequently, after aligning the planar positions of the semiconductor chip 2 and the metal foil 4, the semiconductor chip 2 is bonded to the metal foil 4 by the scrubbing method. More specifically, as shown in FIG. 18B, by lowering the pyramidal collet 21, the semiconductor chip 2 is pressed against the metal foil 4 with a desired pressure, and in this state, the semiconductor chip 2 is vibrated in the direction horizontal to the chip mounting surface of the lead terminal 3DL. By doing so, the drain pad DP of the semiconductor chip 2 is bonded to the metal foil 4 as shown in FIG. 18C. The heat treatment temperature herein is a temperature at which the metal layer 4ma0 of the metal foil 4 melts. Consequently, the metal layer 4ma0 of the metal foil 4 melts, and the above-described compound is formed so that the connection layer 4ma is formed and the metal foil 4 is firmly bonded to the drain pad DP of the semiconductor chip 2. More specifically, the semiconductor chip 2 is electrically connected to the lead terminal 3DL. At this time, since the connection layer 4mc of the metal foil 4 has already been converted into a compound and has a high melting point, the layer does not melt. Since the metal foil 4 can be bonded to the semiconductor chip 2 by the scrubbing method as described above, the ability of eliminating voids between the drain pad DP and the metal foil 4 can be improved.

Figure 19A:
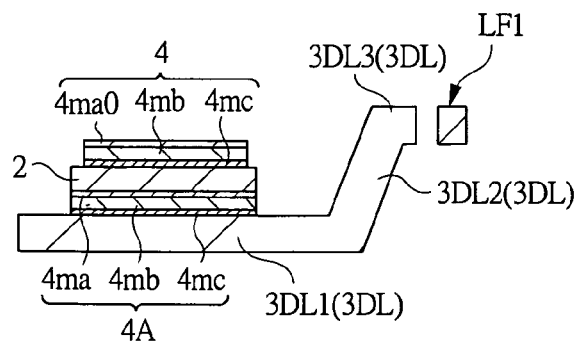
FIG. 19A is a cross-sectional view showing the principal part in the manufacturing process of the semiconductor device subsequent to that of FIG. 18C.
Figure 19B:
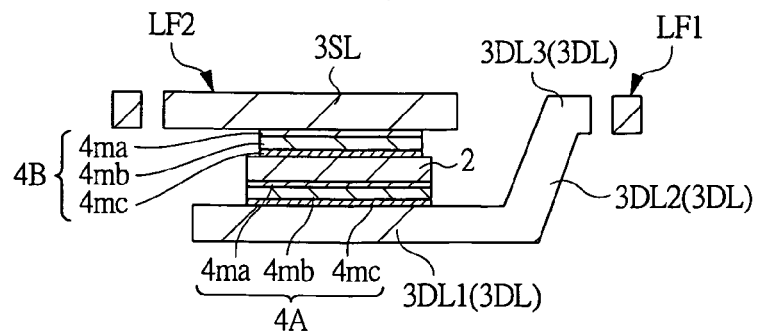
FIG. 19B is a cross-sectional view showing the principal part in the manufacturing process of the semiconductor device subsequent to that of FIG. 19A.

Subsequently, as shown in FIG. 19A, by the scrubbing method similar to that described above, the metal foil 4 is bonded to the source pad SP and the gate pad GP of the principal surface (second principal surface) of the semiconductor chip 2. Then, as shown in FIG. 19B, by the scrubbing method similar to that described above, the lead terminals 3SL and 3GL of the second lead frame LF2 are bonded to the metal foil 4 which is bonded on the principal surface of the semiconductor chip 2. Consequently, the ability of eliminating voids between the source pad SP and the gate pad GP and the metal foil 4 and between the lead terminals 3SL and 3GL and the metal foil 4 can be improved. Since the process after this is the same as that of the sixth embodiment, description thereof will be omitted.

Since voids in the connection parts 4A, 4B, and 4C can be reduced in the seventh embodiment as described above, the thermal resistance and the electrical resistance in the connection parts 4A, 4B, and 4C can be reduced. Therefore, the operation reliability of the power transistor which uses a large current and requires high heat dissipation ability can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the first to seventh embodiments, the cases where the lead terminals 3DL, 3SL, and 3GL and the first and second lead frames LF1 and LF2 are formed of copper have been described. However, the material is not limited to this, and, for example, 42 alloy (Fe-42Ni) can be used. In the case of 42 alloy, although the difference in thermal expansion coefficients between the alloy and silicon is smaller than the difference in thermal expansion coefficients between copper and silicon, when the configurations of the embodiments are applied, cracks in the semiconductor chip and breakage of the connection parts 4A, 4B, and 4C can be suppressed or prevented.

Moreover, in the first to seventh embodiments, the cases where the vertical power MOSFET is formed in the semiconductor chip have been described. However, it is not limited thereto, and the invention can be also applied to the case where a lateral power MOSFET in which a channel is formed between a source and a drain, which are formed on the principal surface of a semiconductor substrate, so as to extend along the principal surface of the semiconductor substrate is formed in a semiconductor chip.

The effects obtained by typical aspects of the present invention will be briefly described below.

Breakage of a semiconductor chip can be suppressed or prevented.

In addition, electrodes and lead terminals of a semiconductor chip can be connected by Pb-free solder without increasing cost.

In addition, soldering quality in mounting of a semiconductor device can be checked by a visual inspection.

In addition, heat dissipation ability and reliability of the semiconductor device can be improved.

What is claimed is:

1. A semiconductor device comprising:
a semiconductor chip having first and second principal surfaces which are positioned on opposite sides, a first electrode formed on said first principal surface, and second and third electrodes formed on said second principal surface;
a resin sealing body which seals said semiconductor chip and has first and second principal surfaces positioned on opposite sides, in which the first principal surface of said resin sealing body is positioned on the first principal surface side of said semiconductor chip and the second principal surface of said resin sealing body is positioned on the second principal surface side of said semiconductor chip;
a first conductive member having one end, which is positioned on the first electrode of said semiconductor chip and connected to the first electrode of said semiconductor chip via first connection means, and the other end on the opposite side of the one end, which is positioned on the second principal surface side of the resin sealing body in comparison with the one end and exposed from said resin sealing body;
a second conductive member connected to the second electrode of said semiconductor chip via second connection means; and
a third conductive member connected to the third electrode of said semiconductor chip via third connection means,
wherein the one end of said first conductive member is exposed from the first principal surface of said resin sealing body, said second and third conductive members are exposed from the second principal surface and side surfaces of said resin sealing body, and each of said first, second, and third connection means includes: a stress buffer layer having a function to buffer thermal stress generated by a difference in thermal expansion coefficients between said first, second, and third conductive members and said semiconductor chip; a first connection layer formed on the semiconductor chip side of said stress buffer layer and having a function to connect said stress buffer layer to the first, second, and third electrodes of said semiconductor chip; and a second connection layer formed on the first, second, and third conductive member side of said stress buffer layer and having a function to connect said stress buffer layer to said first, second, and third conductive members.

2. The semiconductor device according to claim 1, wherein said first and second connection layers are metal layers or metal compound layers having a melting point higher than a melting point of fourth connection means which connects said first, second, and third conductive members to electrodes of a printed circuit board, and said stress buffer layer is a metal layer having a melting point higher than the melting point of the fourth connection means which connects said first, second, and third conductive members to the electrodes of the printed circuit board and having a thermal expansion coefficient between the thermal expansion coefficient of said semiconductor chip and the thermal expansion coefficient of said first, second, and third conductive members or is a metal layer having a melting point higher than the melting point of the fourth connection means which connects said first, second, and third conductive members to the electrodes of the printed circuit board and having yield stress of less than 100 MPa.

3. The semiconductor device according to claim 2, wherein said first and second connection layers are intermetallic compound layers having a melting point of 260° C. or higher, and are formed by reaction between one of Sn, In, Sn—Ag-based, Sn—Cu-based, Sn—Ag—Cu-based, Sn—Zn-based, Sn—Zn—Bi-based, Sn—In-based, In—Ag-based, In—Cu-based, Bi—Sn-based, and Bi—In-based Pb-free solders and at least one metal of Cu, Ag, Ni, and Au at the time of connection.

4. The semiconductor device according to claim 2, wherein said first and second connection layers are Pb-free solder layers having a melting point of 260° C. or higher to 400° C. or lower, and said Pb free solder layers are made of any one of Au—Sn-based alloy, Au—Ge-based alloy, Au—Si-based alloy, Zn—Al-based alloy, Zn—Al—Ge-based alloy, Bi, Bi—Ag-based alloy, Bi—Cu-based alloy, and Bi—Ag—Cu-based alloy.

5. The semiconductor device according to claim 2, wherein said stress buffer layer is a metal layer having a melting point of 260° C. or higher and is made of any one of a Cu/invar alloy/Cu composite material, a Cu/Cu20 composite material, a Cu—Mo alloy, Ti, Mo, and W.

6. The semiconductor device according to claim 2, wherein said stress buffer layer is a metal layer having a melting point of 260° C. or higher and is made of any one of Al, Mg, Ag, Zn, Cu, and Ni.

7. The semiconductor device according to claim 2, wherein said second and third conductive members are protruding from the side surfaces of said resin sealing body.

8. The semiconductor device according to claim 2, wherein the other end of said first conductive member is positioned on a first side surface side of said resin sealing body, and
said second and third conductive members are exposed from the respectively different side surfaces of three side surfaces of said resin sealing body other than said first side surface.

9. The semiconductor device according to claim 2, wherein the other end of said first conductive member is exposed from the second principal surface and a first side surface of said resin sealing body, and
said second and third conductive members are exposed from respectively different side surfaces among three side surfaces of said resin sealing body other than said first side surface.

10. The semiconductor device according to claim 2, wherein said first conductive member includes: a first portion having a part positioned on the first electrode of said semiconductor chip and the other part protruding to outside of said semiconductor chip; a second portion integrally formed with said first portion; and a third portion integrally formed with said second portion and positioned on the second principal surface side of said resin sealing body in comparison with said first portion,
said first portion is exposed from the first principal surface of said resin sealing body, and
said third portion is exposed from said resin sealing body.

11. The semiconductor device according to claim 2, wherein said second portion is an offset part which separates said first portion from said third portion in a thickness direction of said resin sealing body.

12. The semiconductor device according to claim 2, wherein said first conductive member includes: a first portion having a part positioned on the first electrode of said semiconductor chip and the other part protruding to outside of said semiconductor chip; a second portion bending from said first portion toward the second principal surface side of said resin sealing body; and a third portion extending from said second portion in the same direction as the protruding direction of said first portion,
said first portion is exposed from the first principal surface of said resin sealing body, and
said third portion is exposed from said resin sealing body.

13. The semiconductor device according to claim 2, wherein the first electrode of said semiconductor chip is a drain electrode,
the second electrode of said semiconductor chip is a source electrode, and
the third electrode of said semiconductor chip is a gate electrode.

* * * * *